(12) United States Patent
Taniguchi

(10) Patent No.: US 11,510,350 B2
(45) Date of Patent: Nov. 22, 2022

(54) COMPONENT MOUNTER, COMPONENT SUPPLY REEL DRIVING METHOD

(71) Applicant: YAMAHA HATSUDOKI KABUSHIKI KAISHA, Iwata (JP)

(72) Inventor: Yuzuru Taniguchi, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 275 days.

(21) Appl. No.: 16/768,064

(22) PCT Filed: Dec. 6, 2017

(86) PCT No.: PCT/JP2017/043756
§ 371 (c)(1),
(2) Date: May 28, 2020

(87) PCT Pub. No.: WO2019/111344
PCT Pub. Date: Jun. 13, 2019

(65) Prior Publication Data
US 2020/0359536 A1    Nov. 12, 2020

(51) Int. Cl.
*H05K 13/02*   (2006.01)
*H05K 13/04*   (2006.01)

(52) U.S. Cl.
CPC ......... *H05K 13/02* (2013.01); *H05K 13/0419* (2018.08); *H05K 13/0215* (2018.08)

(58) Field of Classification Search
CPC .. H05K 13/02; H05K 13/021; H05K 13/0215; H05K 13/0417; H05K 13/0419; H05K 13/086; Y10T 29/4913; Y10T 29/53174; Y10T 29/53178; B65H 16/10; B65H 16/103; B65H 16/106
See application file for complete search history.

(56) References Cited

U.S. PATENT DOCUMENTS

| | | | | |
|---|---|---|---|---|
| 6,332,268 | B1* | 12/2001 | Imanishi | H01L 21/67132 29/840 |
| 2018/0148289 | A1* | 5/2018 | Oyama | H05K 13/0419 |

FOREIGN PATENT DOCUMENTS

| | | |
|---|---|---|
| JP | 2008-277509 A | 11/2008 |
| JP | 2012-160618 A | 8/2012 |
| JP | 2014-011315 A | 1/2014 |
| JP | 2015-103796 A | 6/2015 |
| JP | 2016-197632 A | 11/2016 |
| JP | 2017-011316 A | 1/2017 |
| WO | 1998012908 A1 | 3/1998 |
| WO | 2016194142 A1 | 12/2016 |

OTHER PUBLICATIONS

International Search Report issued in PCT/JP2017/043756; dated Feb. 6, 2018.

\* cited by examiner

*Primary Examiner* — Peter Dungba Vo
*Assistant Examiner* — Joshua D Anderson
(74) *Attorney, Agent, or Firm* — Studebaker & Brackett PC

(57) ABSTRACT

The unloading operation of winding the carrier tape on the component supply reel by driving the component supply reel to extract the component supply reel from the tape feeder is performed. That is, the carrier tape removed from the tape feeder is wound on the component supply reel. Thus, it is possible to suppress the interference of the preceding tape removed from the tape feeder with the succeeding tape.

9 Claims, 13 Drawing Sheets

F I G. 3
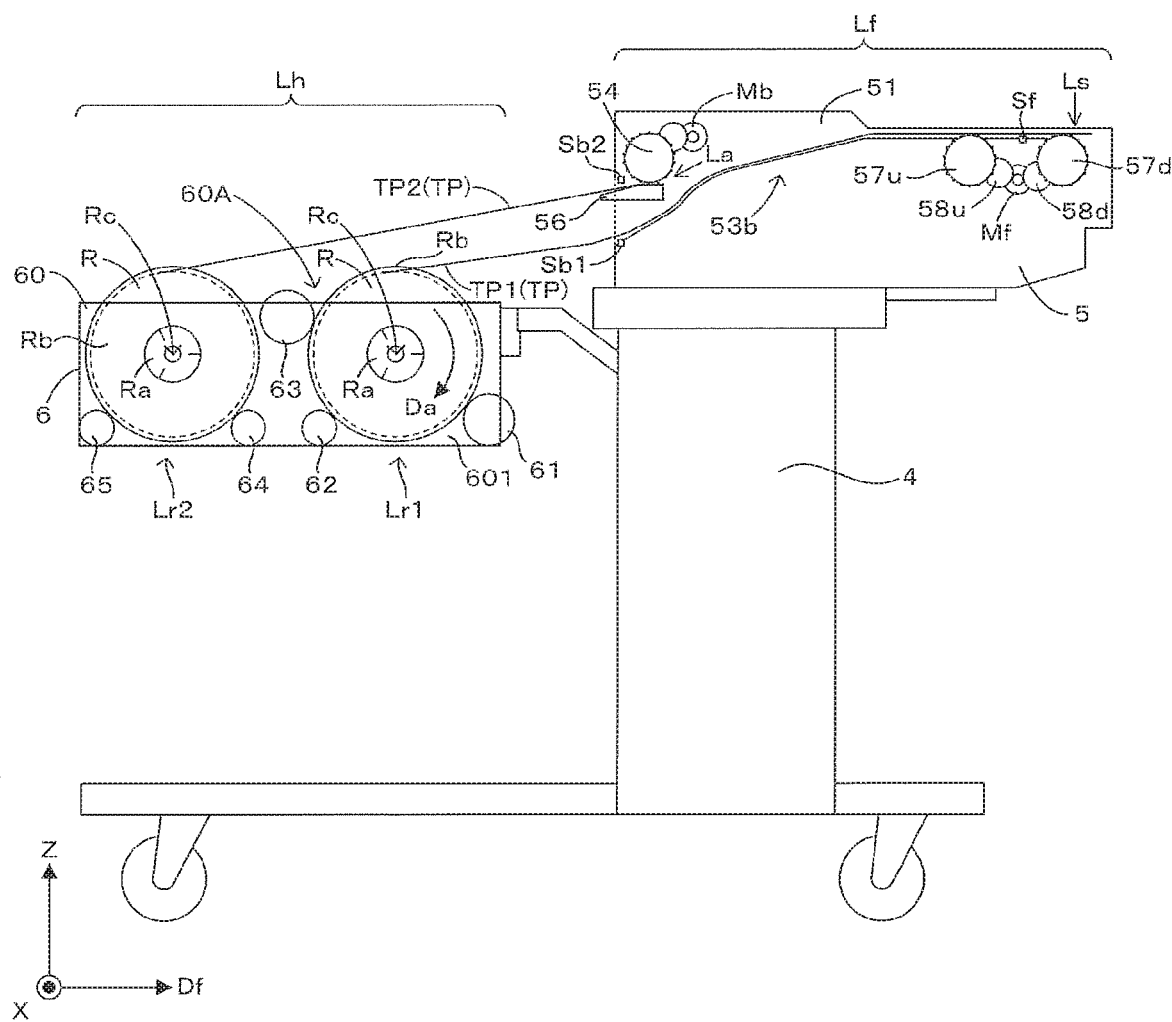

COMPONENT MOUNTER, COMPONENT SUPPLY REEL DRIVING METHOD

CROSS-REFERENCE TO RELATED APPLICATION

This application is a National Stage of International Patent Application No. PCT/JP2017/043756, filed Dec. 6, 2017, the entire contents of which is incorporated herein by reference.

BACKGROUND

Technical Field

This disclosure relates to a technique for supplying a component stored in a tape by conveying the tape pulled out from a component supply reel by a tape feeder.

Background Art

As described in WO2016/194142, in a component mounter, a component supply reel wound with a tape storing components is generally used to supply a component to be mounted. That is, the component is supplied by conveying the tape pulled out from the component supply reel in a feeding direction by the tape feeder, and a mounting head mounts this component on a board. Further, as shown in JP2016/197632, some of component mounters are provided with a driving mechanism for driving a component supply reel. However, the following problems may occur in component mounters using a component supply reel wound with a tape storing components as in WO2016/194142 and JP2016/197632.

SUMMARY

The first problem occurs as a tape to be loaded into the tape feeder is switched according to a change in the type of boards to be produced or the like. As shown in WO2016/194142, such a switch of the tape is performed, for example, through a manual operation of a user. However, such a manual operation causes an increase of the user's burden. To address this problem, a technique capable of reducing the user's burden is illustrated in WO2016/194142.

In this example, the tape feeder is provided with a slope inclined downwardly toward the rear and the tape is loaded into the tape feeder via this slope. In switching from a preceding tape to a succeeding tape, a motor for feeding the preceding tape in the feeding direction is rotated in a reverse direction and the preceding tape is caused to drop from the slope and be removed from the tape feeder, thereby being prepared for the loading of the succeeding tape into the tape feeder. However, in this example, the preceding tape removed from the tape feeder may interfere with the succeeding tape to obstruct the conveyance of the succeeding tape by the tape feeder.

The second problem is caused by a foreign matter or the like sandwiched in a clearance between a component supply reel and a reel holder. That is, if such a foreign matter is sandwiched, the component supply reel does not smoothly rotate and tape conveyance by a tape feeder may be hindered.

The third problem occurs as components of a tape loaded into a tape feeder run out. That is, if the components run out, a splicing operation of connecting a leading end of a succeeding tape to a trailing end of a preceding tape loaded into the tape feeder is performed by a user. However, this splicing operation cannot be performed while the trailing end of the preceding tape is wound on a component supply reel. Thus, the user needs to wait until the tape is removed from the component supply reel according to conveyance in a feeding direction by the tape feeder and an efficient operation of the user may be obstructed.

The fourth problem occurs in driving a component supply reel. That is, as shown in JP2016/197632, a driving mechanism for driving the component supply reel can be provided in a component mounter. However, since this driving mechanism drives a plurality of the component supply reels at once, the component supply reels not required to rotate, out of the plurality of component supply reels, may also rotate.

Accordingly, embodiments described in this disclosure enable the interference of a preceding tape removed from a tape feeder with a succeeding tape to be suppressed, enable proper tape conveyance by the tape feeder regardless of a failure in the rotation of a component supply reel, enable suppression of a reduction in user operation efficiency associated with a splicing operation, and enable the target component supply reel to precisely rotate while preventing the rotation of component supply reels not required to rotate.

A component mounter according a first aspect of the disclosure, comprises a reel holder which rotatably holds a component supply reel wound with a tape storing components; a tape feeder to which the tape pulled out from the component supply reel is loaded and which supplies the component by conveying the tape in a feeding direction; and a reel driving mechanism configured to rotate the component supply reel, The component supply reel rotates in a forward rotation direction following the tape being conveyed in the feeding direction by the tape feeder, and the reel driving mechanism performs an unloading operation of extracting the tape from the tape feeder by driving the component supply reel in a reverse rotation direction opposite to the forward rotation direction to wind the tape on the component supply reel.

A component supply reel driving method according a first aspect of the disclosure, comprises judging whether or not to extract a tape storing components from a tape feeder that conveys the tape pulled out from a component supply reel wound with the tape in a feeding direction. The component supply reel is rotatably held by a reel holder. Also, the method performs an unloading operation of extracting the tape from the tape feeder by driving the component supply reel to wind the tape on the component supply reel when judging to extract the tape.

In the first aspect (component mounter, component supply reel driving method) of the disclosure thus configured, the unloading operation of extracting the tape from the tape feeder by driving the component supply reel to wind the tape on the component supply reel is performed. That is, the tape removed from the tape feeder is wound on the component supply reel. Therefore, the interference of a preceding tape removed from the tape feeder with a succeeding tape can be suppressed.

The component mounter may be configured so that the tape feeder has a tape attaching position to which a leading end of the tape pulled out from the component supply reel is attached and a component supply position provided further in the feeding direction than the tape attaching position, and performs a loading operation of conveying the leading end of the tape attached at the tape attaching position to the component supply position in the feeding direction. A part of a path in which the tape to which the unloading operation is performed passes and a part of a path in which the tape to which the loading operation is performed passes are in common and form a common path. The reel holder holds the component supply reel at each of a first holding position and a second holding position different from the first holding position, after the reel driving mechanism starts the unloading operation for the component supply reel held at one of the first and second holding positions. The tape feeder starts the loading operation for the component supply reel held at the other holding position, and the tape to which the loading operation is performed reaches the common path after the tape to which the unloading operation is performed is removed from the common path. In such a configuration, after the reel driving mechanism starts the unloading operation for one of two component supply reels held by the reel holder, the tape feeder starts the loading operation for the other component supply reel. Therefore, the tape to be loaded into the tape feeder can be quickly switched without depending on a user's manual operation.

The component mounter may be configured so that the reel driving mechanism includes a reel motor, a drive rotating member to be rotated by a drive force of the reel motor, and a rotation transmitter to switch one component supply reel, to which rotation of the drive rotating member is transmitted, between the component supply reel held at the first holding position and the component supply reel held at the second holding position. The rotation transmitter drives the one component supply reel in the reverse rotation direction. In such a configuration, the unloading operation can be selectively performed for one of the two component supply reels held by the reel holder.

The component mounter may be configured so that the rotation transmitter includes a first output rotating member in contact with the component supply reel held at the first holding position, a second output rotating member in contact with the component supply reel held at the second holding position, an intermediate rotating member, an endless belt transmitting rotation of the intermediate rotating member to the second contact member, and an actuator changing a position of the drive rotating member between a first contact position where the drive rotating member is in contact with the first output rotating member and a second contact position where the drive rotating member is in contact with the intermediate rotating member. If the drive rotating member rotates while being located at the first contact position, the first output rotating member rotates following the rotation of the drive rotating member and the component supply reel at the first holding position rotates following rotation of the first output rotating member. If the drive rotating member rotates while being located at the second contact position, the intermediate rotating member rotates following the rotation of the drive rotating member, the endless belt rotates following the rotation of the intermediate rotating member, the second output rotating member rotates following rotation of the endless belt and the component supply reel at the second holding position rotates following rotation of the second output rotating member. In such a configuration, the unloading operation can be selectively performed for one of the two component supply reels held by the reel holder by changing the position of the drive rotating member by the actuator.

The component mounter may be configured so that the tape feeder is set at each of a plurality of feeder setting positions arranged in an alignment direction orthogonal to the feeding direction, the reel holder is set at each of a plurality of holder setting positions provided to correspond to the plurality of feeder setting positions and arranged in the alignment direction, the tape pulled out from the reel holder is loaded into the tape feeder set at the feeder setting position corresponding to the holder setting position where the reel holder is set, and the reel driving mechanism drives the component supply reel held by a target reel holder selected, out of the reel holders set at the plurality of holder setting positions, in the reverse rotation direction. In such a configuration, the component supply reel held by the target reel holder, out of the plurality of reel holders, can be selectively rotated. Therefore, the targeted component supply reel can be precisely rotated while the rotation of the component supply reel not required to rotate is prevented.

The component mounter may be configured so that the reel driving mechanism performs a feed assisting operation of driving the component supply reel in the forward rotation direction as the tape feeder conveys the tape in the feeding direction. In such a configuration, such as when the rotation of the component supply reel is obstructed by a foreign matter or the like sandwiched in a clearance between the component supply reel and the reel holder, the conveyance of the tape in the feeding direction by the tape feeder can be assisted by driving the component supply reel by the feed assisting operation. Therefore, the tape can be properly conveyed by the tape feeder regardless of a failure in the rotation of the component supply reel.

The component mounter may be configured so that the reel driving mechanism performs a splicing preparing operation of removing the tape from the component supply reel by driving the component supply reel in the forward rotation direction. In such a configuration, the splicing preparing operation can be performed to remove the tape from the component supply reel in advance before the tape is removed from the component supply reel according to conveyance in the feeding direction by the tape feeder. Thus, the user can perform a splicing operation without waiting for the removal of the tape from the component supply reel according to the conveyance in the feeding direction by the tape feeder. In this way, a reduction in user operation efficiency associated with the splicing operation can be suppressed.

The component mounter may be configured so that the reel holder includes a supporting member configured to support the component supply reel inserted through an upward facing opening from below a center of the component supply reel, and a contact member contacting the component supply reel on a side above the center. In such a configuration, the escape of the component supply reel from the reel holder can be suppressed by the contact member.

A component mounter according a second aspect of the disclosure, comprises a reel holder which rotatably holds a component supply reel wound with a tape storing components; a tape feeder to which the tape pulled out from the component supply reel is loaded and which supplies the component by conveying the tape in a feeding direction; and a reel driving mechanism configured to rotate the component supply reel, The component supply reel rotates in a forward rotation direction following the tape being conveyed in the feeding direction by the tape feeder, and the reel driving mechanism performs a feed assisting operation of driving the component supply reel in the forward rotation direction as the tape feeder conveys the tape in the feeding direction.

A component supply reel driving method according a second aspect of the disclosure, comprising judging whether or not to assist conveyance of a tape in a feeding direction by a tape feeder, the tape storing components and being pulled out from a component supply reel rotatably held by a reel holder and wound with the tape; and performing a feed assisting operation of driving the component supply reel in a direction to reel out the tape from the component supply reel as the tape is conveyed in the feeding direction by the tape feeder when judging to assist.

In the second aspect (component mounter, component supply reel driving method) of the disclosure thus configured, such as when the rotation of the component supply reel is obstructed by a foreign matter or the like sandwiched in a clearance between the component supply reel and the reel holder, the conveyance of the tape in the feeding direction by the tape feeder can be assisted by driving the component supply reel by the feed assisting operation. Therefore, the tape can be properly conveyed by the tape feeder regardless of a failure in the rotation of the component supply reel.

The component mounter may further comprises a controller that controls the reel driving mechanism, wherein the tape feeder includes a feeder motor and a current source that supplies a current to the feeder motor, and the feeder motor drives the tape in the feeding direction by applying a torque corresponding to a value of the current supplied from the feeder motor to the tape, and the controller causes the reel driving mechanism to perform the feed assisting operation when the value of the current becomes equal to or more than a threshold current value. In such a configuration, if a load of the feeder motor of the tape feeder becomes excessive and the value of the current supplied to the feeder motor becomes equal to or more than the threshold current because the rotation of the component supply reel is obstructed, the feed assisting operation is performed. Therefore, the tape can be properly conveyed by the tape feeder by reducing the load of the feeder motor regardless of a failure in the rotation of the component supply reel.

The component mounter may further comprises a notifier configured to notify an error to a user, and the controller causes the notifier to notify the error if the value of the current does not become less than the threshold current value after the start of the feed assisting operation. In such a configuration, if the load of the feeder motor is not reduced despite the execution of the feed assisting operation, an error is notified to the user and the user can be prompted to perform a maintenance operation.

A component mounter according to a third aspect of the disclosure, comprises a reel holder which rotatably holds a component supply reel wound with a tape storing components; a tape feeder to which the tape pulled out from the component supply reel is loaded and which supplies the component by conveying the tape in a feeding direction; and a reel driving mechanism configured to rotate the component supply reel. The component supply reel rotates in a forward rotation direction following the tape being conveyed in the feeding direction by the tape feeder, and the reel driving mechanism performs a splicing preparing operation of removing the tape from the component supply reel by driving the component supply reel in the forward rotation direction.

A component supply reel driving method according to a third aspect of the disclosure, comprises judging whether or not to remove a tape storing component and pulled out from a component supply reel rotatably held by a reel holder and wound with the tape from the component supply reel; and performing a splicing preparing operation of removing the tape from the component supply reel by driving the component supply reel in a direction to reel out the tape from the component supply reel when judging to remove the tape from the component supply reel.

In the third aspect (component mounter, component supply reel driving method) of the disclosure thus configured, the tape can be removed from the component supply reel in advance by performing the splicing preparing operation before the tape is removed from the component supply reel according to conveyance in the feeding direction by the tape feeder. Thus, the user can perform the splicing operation without waiting for the removal of the tape from the component supply reel according to the conveyance in feeding direction by the tape feeder. In this way, a reduction in user operation efficiency associated with the splicing operation can be suppressed.

The component mounter may further comprises a controller that controls the reel driving mechanism. The controller causes the reel driving mechanism to perform the splicing preparing operation when a remaining number of the components in the tape wound on the component supply reel becomes equal to or less than a threshold remaining number. In such a configuration, the tape can be removed from the component supply reel in advance by performing the splicing preparing operation if the remaining number of the components in the tape wound on the component supply reel becomes equal to or more than the threshold remaining number. Thus, the user can start the splicing operation when the remaining number of the components becomes equal to or more than the threshold remaining number. In this way, a reduction in user operation efficiency associated with the splicing operation can be suppressed.

A component mounter according to a fourth aspect of the disclosure, comprises a plurality of reel holders that respectively rotatably hold component supply reels wound with tapes storing components. The plurality of reel holders are arranged in an alignment direction. The component mounter further comprises a reel driving mechanism configured to rotate the component supply reel held by a target reel holder selected out of the plurality of reel holders.

A component supply reel driving method according to a fourth aspect of the disclosure, comprises selecting a target reel holder out of a plurality of reel holders arranged in an alignment direction and rotatably holding component supply reel wound with a tape storing components; and rotating the component supply reel held by the target reel holder.

In the fourth aspect (component mounter, component supply reel driving method) of the disclosure thus configured, the component supply reel held by the target reel holder, out of the plurality of reel holders, can be selectively rotated. Therefore, the targeted component supply reel can be precisely rotated while the rotation of the component supply reel not required to rotate is prevented.

The component mounter may be configured so that the reel driving mechanism includes a reel motor, a drive rotating member to be rotated by a drive force of the reel motor, and a transmission switcher to switch the reel holder as a rotation transmission target of the drive rotating member among the plurality of reel holders, and rotates the component supply reel held by the target reel holder by selectively transmitting rotation of the drive rotating member to the component supply reel held by the target reel holder by the transmission switcher. In such a configuration, the rotation of the drive rotating member can be selectively transmitted to the component supply reel held by the target reel holder by the transmission switcher that switches the reel holder as the transmission target of a rotation of the drive rotating member. Therefore, the targeted component supply reel can be precisely rotated while the rotation of the component supply reel not required to rotate is prevented.

The component mounter may be configured so that the reel holder includes a following rotating member to be rotated following the rotation of the drive rotating member while being held in contact with the drive rotating member and rotates the component supply reel according to rotation of the following rotating member. The reel motor and the drive rotating member are unitized as a driving unit, and the transmission switcher includes a unit driver to move the driving unit in the alignment direction and rotates the component supply reel held by the target reel holder by rotating the drive rotating member while selectively bringing the drive rotating member into contact with the following rotating member of the target reel holder by moving the driving unit by the unit driver. In such a configuration, the reel holder having the following rotating member in contact with the drive rotating member is selected as the rotation transmission target of the drive rotating member, out of the plurality of reel holders. Therefore, the rotation of the drive rotating member can be selectively transmitted to the component supply reel held by the target reel holder by driving the driving unit by the unit driver to switch the reel holder having the following rotating member in contact with the drive rotating member. Therefore, the targeted component supply reel can be precisely rotated while the rotation of the component supply reel not required to rotate is prevented.

The component mounter may be configured so that the drive rotating member and the following rotating member are magnet rollers, and the following rotating member rotates following the rotation of the drive rotating member by a magnetic force generated between the following rotating member and the drive rotating member. In such a configuration, the rotation of the drive rotating member can be precisely transmitted to the following rotating member of the target reel holder by the magnetic force of the magnet rollers. Further, since a friction force between the drive rotating member and the following rotating member is relatively small, the following rotating member is little affected by the friction force between the following rotating member and the drive rotating member in driving the drive rotating member to switch the rotation transmission target of the drive rotating member. That is, the rotation transmission target of the drive rotating member can be switched while an influence on the following rotating member of the reel holder, eventually on the component supply reel, is suppressed.

The component mounter may be configured so that the drive rotating member and the following rotating member are rubber rollers, and the following rotating member rotates following the rotation of the drive rotating member by a friction force generated between the following rotating member and the drive rotating member. In such a configuration, the rotation of the drive rotating member can be precisely transmitted to the following rotating member of the target reel holder by the fictional force of the rubber rollers.

The component mounter may be configured so that the transmission switcher changes a position of the drive rotating member between a position in contact with the following rotating member and a position separated from the following rotating member by driving the drive rotating member in a direction orthogonal to the alignment direction, and moves the driving unit in the alignment direction by the unit driver with the drive rotating member separated from the following rotating member. In such a configuration, the drive rotating member is separated from the following rotating member in driving the drive rotating member to switch the rotation transmission target of the drive rotating member. Therefore, the rotation transmission target of the drive rotating member can be switched while an influence on the following rotating member of the reel holder, eventually on the component supply reel, is suppressed.

According to the first aspect of the disclosure, the interference of the preceding tape removed from the tape feeder with the succeeding tape can be suppressed. According to the second aspect of the disclosure, the tape can be properly conveyed by the tape feeder regardless of a failure in the rotation of the component supply reel. According to the third aspect of the disclosure, a reduction in user operation efficiency associated with the splicing operation can be suppressed. According to the fourth aspect of the disclosure, the targeted component supply reel can be precisely rotated while the rotation of the component supply reel not required to rotate is prevented.

BRIEF DESCRIPTION OF THE DRAWINGS

FIG. 3 is a side view schematically showing the tape feeder and the reel holder set on the feeder setting carriage;

DETAILED DESCRIPTION

Figure 1:
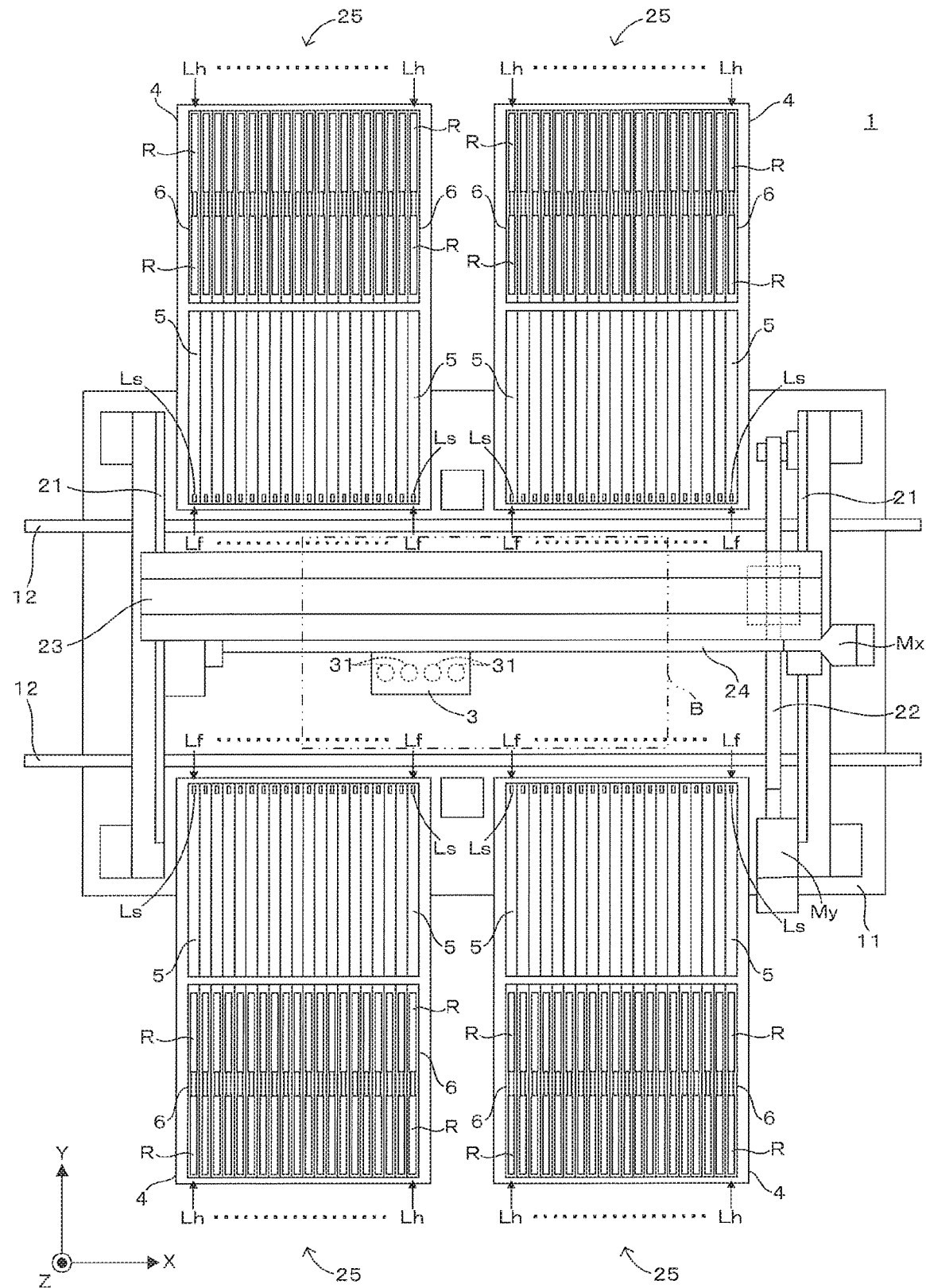
FIG. 1 is a partial plan view schematically showing a component mounter according to the disclosure.

FIG. 1 is a partial plan view schematically showing a component mounter according to the disclosure. In FIG. 1, an XYZ Cartesian coordinate system composed of a Z direction parallel to a vertical direction and X and Y directions orthogonal to the vertical direction is shown. This component mounter 1 includes a pair of conveyors 12, 12 provided on a base 11. The component mounter 1 mounts components on a board B carried into an operating position (position of the board B of FIG. 1) from an upstream side in the X direction (board conveying direction) by the conveyors 12, and the board B finished with component mounting is carried out to a downstream side in the X direction from the operating position by the conveyors 12. Note that the mounting of the components on the board B means the placement of the components on the board B.

A pair of Y-axis rails 21, 21 extending in the Y direction, a Y-axis ball screw 22 extending in the Y direction and a Y-axis motor My for rotationally driving the Y-axis ball screw 22 are provided in the component mounter 1, and a head supporting member 23 is fixed to a nut of the Y-axis ball screw 22 while being supported on the pair of Y-axis rails 21, 21 movably in the Y direction. An X-axis ball screw 24 extending in the X direction and an X-axis motor Mx for rotationally driving the X-axis ball screw 24 are mounted on the head supporting member 23, and a head unit 3 is fixed to a nut of the X-axis ball screw 24 while being supported on the head supporting member 23 movably in the X direction. Thus, the head unit 3 can be moved in the Y direction by rotating the Y-axis ball screw 22 by the Y-axis motor My or can be moved in the X direction by rotating the X-axis ball screw 24 by the X-axis motor Mx.

Two component supply units 25 are arranged in the X direction on each of both sides of the pair of conveyors 12, 12 in the Y direction, and a feeder setting carriage 4 is detachably attached to each component supply unit 25. A plurality of feeder setting position Lf are arranged in the X direction in this feeder setting carriage 4 and a tape feeder 5 is detachably set at each of these feeder setting positions Lf. In this way, a plurality of the tape feeders 5 are arranged in the X direction. Further, a plurality of holder setting positions Lh are arranged in the X direction in the feeder setting carriage 4 and a reel holder 6 is detachably set at each of these holder setting positions Lh. In this way, a plurality of the reel holders 6 are arranged in the X direction. The plurality of feeder setting positions Lf and the plurality of holder setting positions Lh are arranged in a one-to-one correspondence and one feeder setting position Lf and one holder setting position Lh corresponding to each other are arranged in the Y direction. In other words, the plurality of tape feeders 5 and the plurality of reel holders 6 are arranged in a one-to-one correspondence and one tape feeder 5 and one reel holder 6 corresponding to each other are arranged in the Y direction.

A carrier tape TP (FIG. 2) storing components (chip electronic components) in the form of small pieces such as integrated circuits, transistors and capacitors at predetermined intervals is wound on a component supply reel R held by each reel holder 6. This carrier tape TP is a conventionally known embossed tape and configured to cover the components stored in each of a plurality of pockets aligned in a row at equal intervals with a cover. Further, a plurality of engaging holes aligned at given intervals along an edge penetrate through one side of the carrier tape TP. As described later, two carrier tapes TP can be set to each tape feeder 5 and, correspondingly, each reel holder 6 holds two component supply reels R arranged in the Y direction. Each tape feeder 5 supplies the components in the carrier tape TP to a predetermined component supply position Ls by intermittently feeding the carrier tape TP pulled out from the component supply reel R in the corresponding reel holder 6 toward the head unit 3 (in a feeding direction Df in FIG. 2 and the like).

The head unit 3 includes a plurality of (four) mounting heads 31 arranged in the X direction. Each mounting head 31 has an elongated shape extending in the Z direction (vertical direction) and can suck the component by a nozzle disengageably attached on the lower end thereof. That is, the mounting head 31 moves to a position above the component supply position Ls of the tape feeder 5 and sucks the component supplied by the tape feeder 5 from the component supply position Ls. Subsequently, the mounting head 31 moves to a position above the board B at the operating position and releases the sucked component, thereby mounting the component on the board B. In this way, the mounting head 31 performs component mounting by taking out the component supplied to the component supply position Ls by the tape feeder 5 from the carrier tape TP and mounting the component on the board B.

Figure 2:
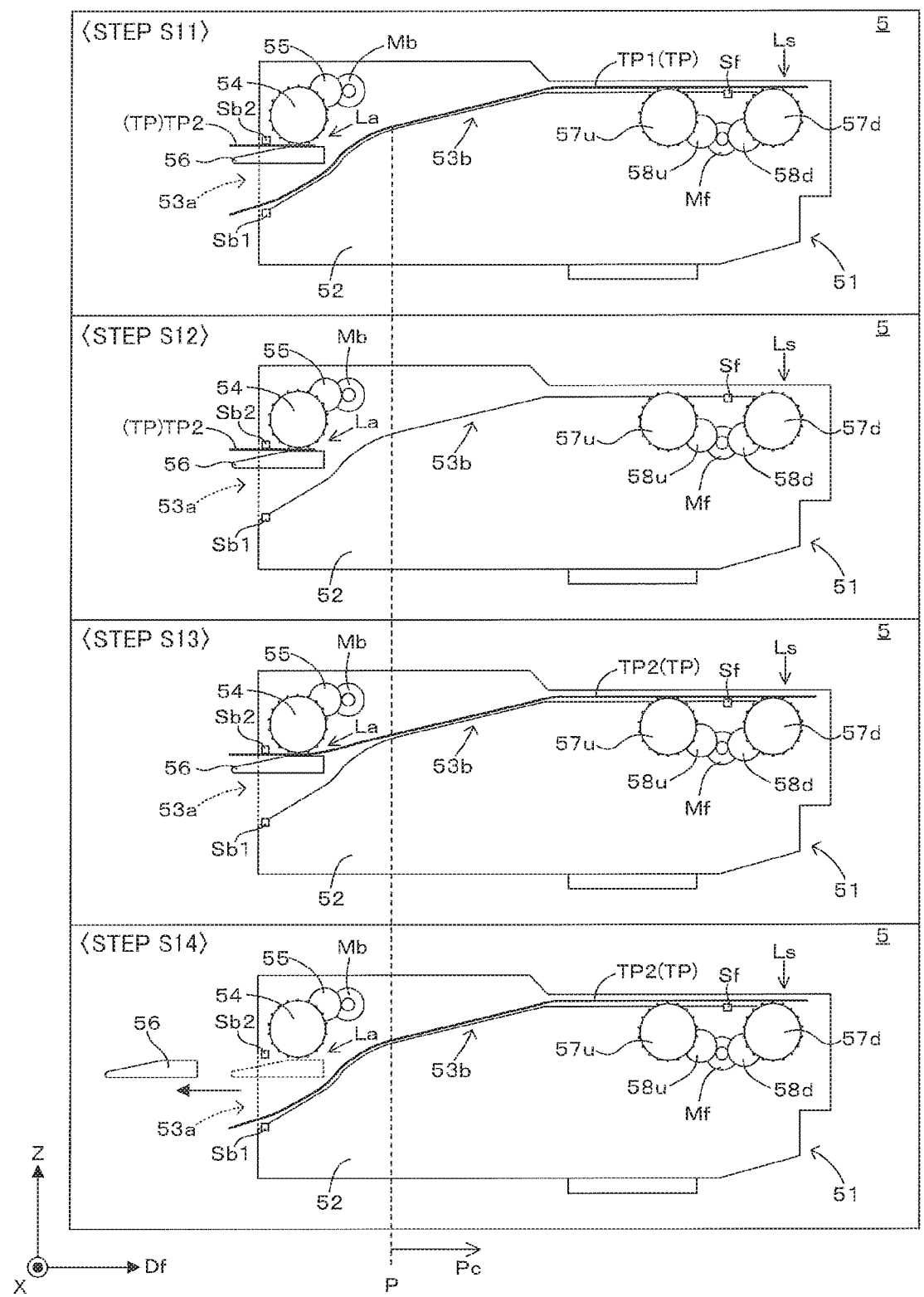
FIG. 2 is a side view schematically showing an example of a configuration and an operation of the tape feeder.

FIG. 2 is a side view schematically showing an example of a configuration and an operation of the tape feeder. In FIG. 2 and subsequent figures, the feeding direction Df (parallel to the Y direction) in which the tape feeder 5 feeds the carrier tape TP is shown as appropriate and an arrow side of the feeding direction Df is defined as a "front side" in the feeding direction Df and a side opposite to the arrow side of the feeding direction Df is defined as a "rear side" in the feeding direction Df as appropriate. Further, to distinguish the two carrier tapes TP settable to the tape feeder 5, different reference signs TP1, TP2 are used for the carrier tapes as appropriate in FIG. 2 and subsequent figures.

The tape feeder 5 includes a feeder body 51 having a mechanical configuration and feeder motors Mf, Mb for driving the carrier tapes TP. The feeder body 51 includes a flat case 52 thin in the X direction and long in the feeding direction Df. A tape insertion opening 53a (shown by a broken line) extending in the Z direction is open in the rear end of the case 52 in the feeding direction Df, and the component supply position Ls is provided on the upper surface of a front end part of the case 52 in the feeding direction Df. A tape conveyance path 53b extending from the tape insertion opening 53a to the component supply position Ls is provided in the feeder body 51. This feeder body 51 supplies the component to the component supply position Ls by feeding the carrier tape TP inserted into the tape conveyance path 53b from the tape insertion opening 53a in the feeding direction Df by receiving a drive force of the feeder motor Mf, Mb.

The feeder body 51 includes a sprocket 54 arranged above the tape conveyance path 53b and adjacent to the tape insertion opening 53a and a gear 55 for transmitting the drive force of the feeder motor Mb to the sprocket 54 in the case 52, and the sprocket 54 rotates upon receiving the drive force generated by the feeder motor Mb. The feeder body 51 further includes a tape supporting member 56 detachably attached in the case 52. This tape supporting member 56 faces the sprocket 54 from below and sandwiches the carrier tape TP between the tape supporting member 56 and the sprocket 54, thereby engaging the carrier tape TP with the sprocket 54. In this way, a leading end of the carrier tape TP is attached at a tape attaching position La between the sprocket 54 and the tape supporting member 56. Thus, the feeder motor Mb can convey the carrier tape TP engaged with the sprocket 54 in the feeding direction Df by rotating in a forward direction (forward rotation). Further, the feeder motor Mb can convey the carrier tape TP engaged with the sprocket 54 in a direction opposite to the feeding direction Df (toward a rear side) by rotating in a reverse direction opposite to the forward direction (reverse rotation).

Further, the feeder body 51 includes two sprockets 57d, 57u arranged in a front end part of the feeder body 51 and adjacent to the tape conveyance path 53b from below and two gears 58d, 58u for transmitting the drive force of the feeder motor Mf to each of the sprockets 57d, 57u in the case 52. The sprockets 57d, 57u rotate upon receiving the drive force generated by the feeder motor Mf. Thus, the feeder motor Mf can intermittently convey the carrier tape TP engaged with the sprockets 57d, 57u in the feeding direction Df by intermittently rotating in a forward direction (forward rotation). Further, the feeder motor Mf can convey the carrier tape TP engaged with the sprockets 57d, 57u in the direction opposite to the feeding direction Df (toward the rear side) by rotating in a reverse direction opposite to the forward direction (reverse rotation).

In FIG. 2, Step S11 corresponds to a state where the mounting head 31 is performing component mounting. That is, the carrier tape TP1 is loaded along the tape conveyance path 53b in the feeder body 51, and the sprockets 57d, 57u supply the component to the component supply position Ls by intermittently conveying the carrier tape TP1 in the feeding direction Df. Then, the mounting head 31 mounts the component supplied to the component supply position Ls on the board B. Further, in Step S11, a leading end of the carrier tape TP2 used for the production of a different type of boards following the production of a type of boards produced using the carrier tape TP1 is attached between the sprocket 54 and the tape supporting member 56. In this way, the carrier tape TP2 used for the production of the next type of boards B can be attached in the rear end part of the feeder body 51.

As shown in Step S12, in switching from the carrier tape TP1 to the carrier tape TP2, the carrier tape TP is conveyed toward an upstream side in the feeding direction Df and discharged from the tape feeder 5 by an unloading operation to be described in detail later. Then, a loading operation shown in Step S13 is performed to load the carrier tape TP into the feeder body 51. Specifically, the leading end of the carrier tape TP2 is fed in the feeding direction Df from the tape attaching position La to the component supply position Ls by starting the rotation of the sprocket 54, and engaged with the sprockets 57d, 57u.

In component mounting, the component is supplied to the component supply position Ls by the sprockets 57d, 57u intermittently conveying the carrier tape TP2 loaded by the loading operation in the feeding direction Df. Note that the carrier tape TP may be intermittently conveyed only by the sprockets 57d, 57u or by the cooperation of the sprockets 57d, 57u and the sprocket 54.

Further, as shown in Step S14, if the user (operator) removes the tape supporting member 56 from the case 52, the carrier tape TP2 is disengaged from the sprocket 54 and drops to the tape conveyance path 53b. In this way, the user can attach the carrier tape TP used for component mounting following the carrier tape TP2 at the tape attaching position La between the sprocket 54 and the tape supporting member 56 when attaching the tape supporting member 56 in the case 52 again.

Here, as can be understood, for example, from the comparison of Steps S11 and S13 of FIG. 2, a path in which the carrier tape TP1 to be unloaded passes and a path in which the carrier tape TP2 to be loaded passes overlap (in other words, are in common) on a side downstream (forward) of a branch point P in the feeding direction Df. On the other hand, the path in which the carrier tape TP1 to be unloaded passes and the path in which the carrier tape TP2 to be loaded passes are different on a side upstream (rearward) of the branch point P in the feeding direction Df. That is, the path in which the carrier tape TP1 being unloaded passes and the path in which the carrier tape TP2 being loaded passes commonly form a common path Pc in a part (side downstream of the branch point P in the feeding direction Df).

Incidentally, the tape feeder 5 includes three tape sensors Sf, Sb1 and Sb2 and the loading/unloading operation of the carrier tape TP is performed with reference to detection results of these tape sensors Sf, Sb1 and Sb2 as described later. The tape sensor Sf is arranged between two sprockets 57d, 57u and detects the carrier tape TP behind and near the component supply position Ls in the feeding direction Df. The tape sensor Sb1 is arranged in the rear end part of the tape feeder 5 (i.e. rearward of the tape sensor Sf in the feeding direction Df) and detects the carrier tape TP in front of and near the tape insertion opening 53a in the feeding direction Df. The tape sensor Sb2 is arranged in the rear end part of the tape feeder 5 (i.e. rearward of the tape sensor Sf in the feeding direction Df) and detects the carrier tape TP at the tape attaching position La. Any of these tape sensors Sb1, Sb2 is arranged upstream of the common path Pc in the feeding direction Df. These tape sensors Sf, Sb1 and Sb2 output ON-signals while detecting the carrier tape TP and outputs OFF-signals while not detecting the carrier tape TP.

FIG. 3 is a side view schematically showing the tape feeder and the reel holder set on the feeder setting carriage. The component supply reel R held by the reel holder 6 includes a center shaft Ra and two side plates Rb sandwiching the center shaft Ra from both sides in the X direction, and the carrier tape TP is wound on the center shaft Ra. Each side plate Rb has a disc shape and is provided concentrically with the center shaft Ra. By sandwiching the carrier tape TP wound on the center shaft Ra from both sides by the two side plates Rb in this way, the lateral escape of the carrier tape TP from the center shaft Ra is suppressed.

A housing 60 of the reel holder 6 includes two side covers 601 spaced apart in the X direction, and an opening 60A is open upward between these side covers 601. In the X direction, an interval between the two side covers 601 is slightly larger than a thickness of the component supply reel R, and the component supply reel R inserted through the opening 60A can be housed between these side covers 601. This reel holder 6 rotatably holds the component supply reel R with an axis of rotation (center Rc) parallel to the X direction as a center. Particularly, the reel holder 6 can rotatably hold the component supply reels R at a reel holding position Lr1 and a reel holding position Lr2 behind the reel holding position Lr1 in the feeding direction Df.

That is, the reel holder 6 includes a driven roller 61 arranged in front of the reel holding position Lr1 and following rollers 62, 63 arranged behind the reel holding position Lr1. N-poles and S-poles of a magnet are alternately arranged in a circumferential direction on the circumferential surface of the driven roller 61, and the driven roller 61 is a so-called magnet roller. The driven roller 61 and the following rollers 62, 63 are arranged between the two side covers 601 and rotatable about axes of rotation parallel to the X direction. The driven roller 61 and the following roller 62 support the peripheral edge of the component supply reel R inserted to the reel holding position Lr1 through the opening 60A from below the center Rc (axis of rotation of the component supply reel R), whereas the following roller 63 is in contact with the peripheral edge of the component supply reel R on a side above the center Rc.

Further, the reel holder 6 includes a following roller 64 arranged in front of the reel holding position Lr2 and a following roller 65 arranged behind the reel holding position Lr2 in the feeding direction Df. The following rollers 64, 65 are arranged between the two side covers 601 and rotatable about axes of rotation parallel to the X direction. The following rollers 64, 65 support the peripheral edge of the component supply reel R inserted to the reel holding position Lr2 through the opening 60A from below the center Rc. Incidentally, front and rear sides with respect to the reel holding positions Lr1, Lr2 described above can be determined on the basis of the centers Rc of the component supply reels R held at the reel holding positions Lr.

The carrier tapes TP pulled out from the component supply reels R respectively held at the reel holding positions Lr1, Lr2 of the reel holder 6 are set to the tape feeder 5 corresponding to the reel holder 6. In an example shown in FIG. 3, the carrier tape TP1 pulled out from the component supply reel R held at the reel holding position Lr1 is loaded to the component supply position Ls along the tape conveyance path 53b, and the carrier tape TP2 pulled out from the component supply reel R held at the reel holding position Lr2 is attached at the tape attaching position La. If the carrier tape TP1 pulled out from the component supply reel R at the reel holding position Lr1 is conveyed in the feeding direction Df by the tape feeder 5, this component supply reel R is driven to rotate in a forward rotation direction Da (clockwise direction of FIG. 3) by being pulled by the carrier tape TP.

Figure 4:
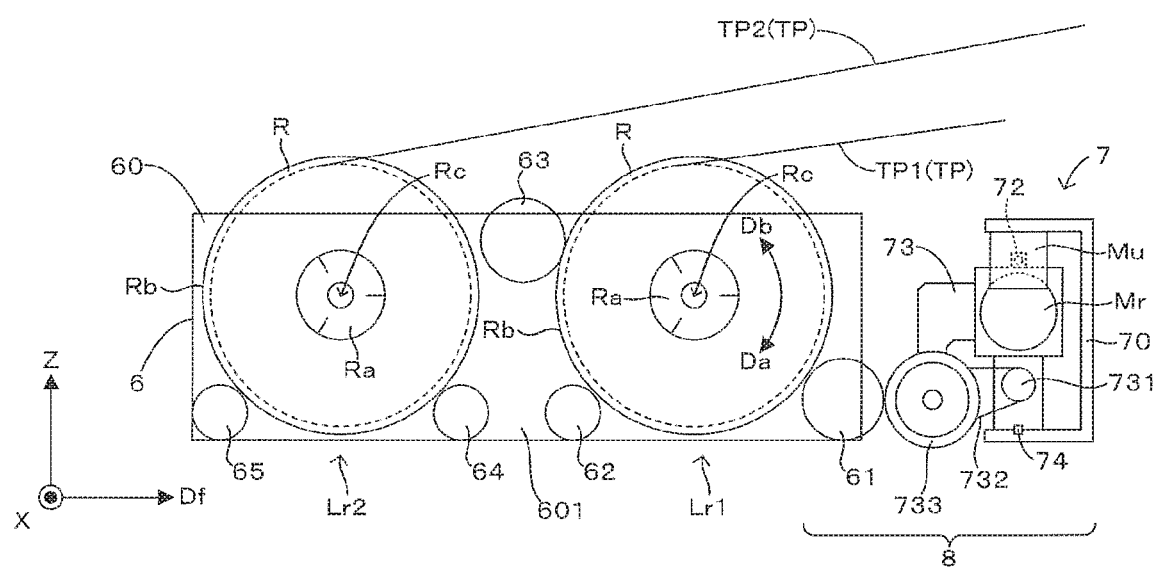
FIG. 4 is a side view schematically showing an example of the roller driver for driving the driven roller of the reel holder.
Figure 5:
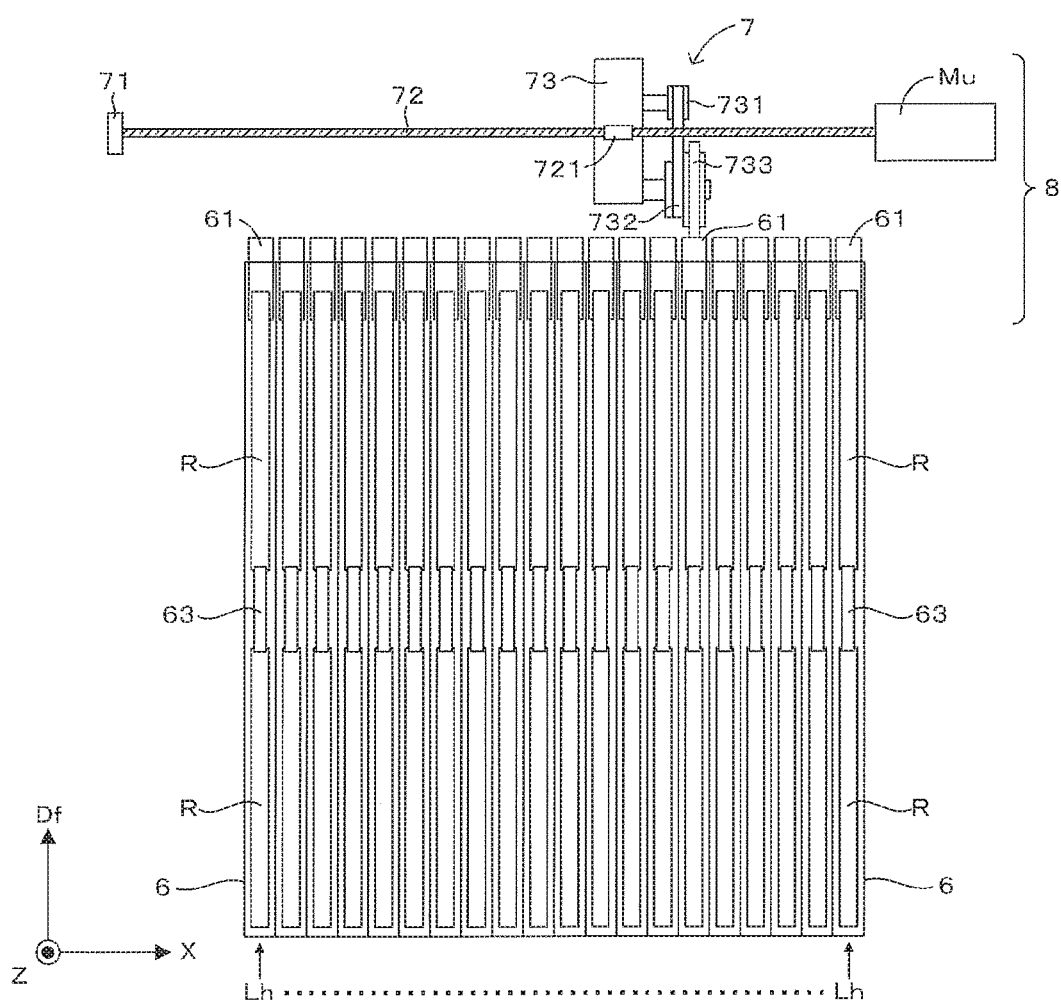
FIG. 5 is a plan view schematically showing an example of the roller driver for driving the driven rollers of the reel holders.

Further, the component mounter 1 of FIG. 1 includes roller drivers 7 (FIGS. 4 and 5) for driving the driven rollers 61 of the reel holders 6. FIG. 4 is a side view schematically showing an example of the roller driver for driving the driven roller of the reel holder, and FIG. 5 is a plan view schematically showing an example of the roller driver for driving the driven rollers of the reel holders. In FIGS. 4 and 5, the reel holders 6 and the component supply reels R are shown together with the roller driver 7.

The roller driver 7 is provided for each component supply unit 25 and includes a housing 70 (not shown in FIG. 5), a bearing 71 (not shown in FIG. 4), a ball screw 72 and a unit motor Mu. The housing 70 is provided to extend longer than the plurality of reel holders 6 arranged in the component supply unit 25 in the X direction and the unit motor Mu and the bearing 71 are attached on both ends of the housing 70 in the X direction. The ball screw 72 is provided to extend longer than the plurality of reel holders 6 in the X direction, one end thereof is fixed to the unit motor Mu and the other end thereof is borne by the bearing 71. A driving unit 73 of the roller driver 7 is fixed to a nut 721 of the ball screw 72. Thus, the unit motor Mu can move the driving unit 73 in the X direction by rotating the ball screw 72.

The driving unit 73 is configured by unitizing a reel motor Mr, an intermediate roller 731, an endless belt 732 and a drive roller 733, fixed to the ball screw 72 and supported on the housing 70 via a guide rail 74 extending in the X direction. The drive roller 733 is movable in the X direction as the driving unit 73 is driven by the unit motor Mu. A moving range of this drive roller 733 includes a range from a position facing the driven roller 61 of the reel holder 6 on one end, out of the plurality of reel holders 6, to a position facing the driven roller 61 of the reel holder 6 on the other end in the X direction.

The intermediate roller 731 and the drive roller 733 are supported rotatably about an axis of rotation parallel to the X direction, and the endless belt 732 hangs on the intermediate roller 731 and the drive roller 733. The intermediate roller 731 is connected to the reel motor Mr by a gear or the like, and the reel motor Mr can rotate the drive roller 733 via the intermediate roller 731 and the endless belt 732.

N-poles and S-poles of a magnet are alternately arranged in a circumferential direction on the circumferential surface of the drive roller 733, and the drive roller 733 is a so-called magnet roller. The circumferential surface of the drive roller 733 is in contact with the circumferential surface of the driven roller 61 of the reel holder 6. Thus, if the drive roller 733 rotates, the driven roller 61 is driven to rotate by a magnetic force acting between the drive roller 733 and the driven roller 61. Further, as described above, the driven roller 61 is in contact with the peripheral edge of the component supply reel R held at the reel holding position Lr1. Thus, if the driven roller 61 rotates, the component supply reel R is driven to rotate by a friction force acting between the drive roller 61 and the component supply reel R. Therefore, the roller driver 7 can rotate the component supply reel R in the forward rotation direction Da by rotating the reel motor Mr in a forward direction (forward rotation) and can rotate the component supply reel R in a reverse rotation direction Db opposite to the forward rotation direction Da by rotating the reel motor Mr in a reverse direction opposite to the forward direction (reverse rotation). As just described, in the example of FIGS. 4 and 5, the roller driver 7 and the driven roller 61 cooperate to function as a "reel driving mechanism 8" for driving the component supply reel R.

Figure 6:
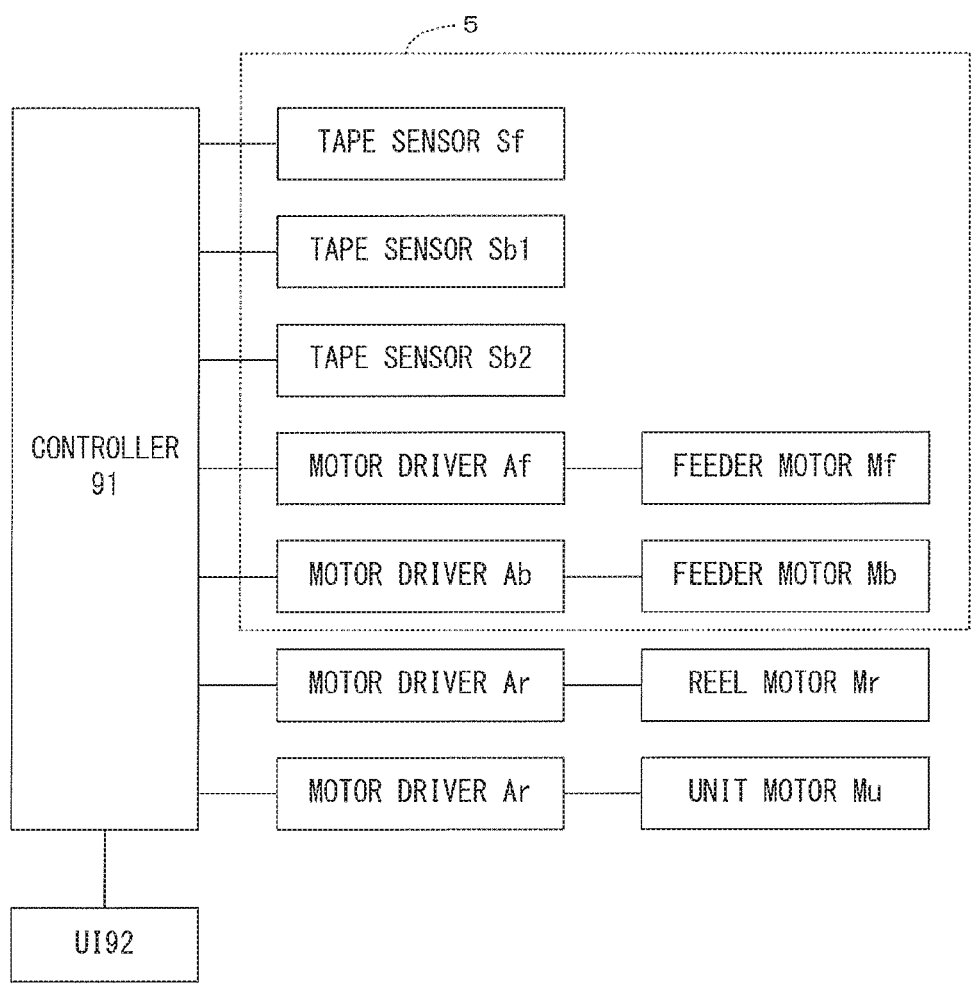
FIG. 6 is a block diagram showing an electrical configuration of the component mounter of FIG. 1.

FIG. 6 is a block diagram showing an electrical configuration of the component mounter of FIG. 1. A configuration shown within a broken line showing the tape feeder 5 in FIG. 6 is provided for each tape feeder 5. The component mounter 1 includes a controller 91 for integrally controlling the entire machine. The controller 91 is a processor constituted by a CPU (Central Processing Unit) and a RAM (Random Access Memory). This controller 91 drives the carrier tape TP by controlling each motor Mf, Mb, Mr, Mu. Specifically, in the component mounter 1, a motor driver Af is provided to correspond to the feeder motor Mf, a motor driver Ab is provided to correspond to the feeder motor Mb, a motor driver Ar is provided to correspond to the reel motor Mr and a motor driver Au is provided to correspond to the unit motor Mu. Each motor driver Af, Ab, Ar, Au supplies a current to the corresponding motor Mf, Mb, Mr, Mu and each of motor Mf, Mb, Mr, Mu outputs a torque corresponding to a value of the supplied current. Then, the controller 91 controls the rotation direction and torque of the motor Mf, Mb, Mr, Mu by controlling the current output by the motor driver Af, Ab, Ar, Au. In such a motor control, the controller 91 refers to detection results of the tape sensors Sf, Sb1 and Sb2 as appropriate. Further, the component mounter 1 includes a UI (User Interface) 92 and gives a necessary notification to the user via the UI 92 according to a driven state of the carrier tape TP. This UI 92 is, for example, constituted by a touch panel display or the like.

The aforementioned tape feeder 5 and reel driving mechanism 8 can perform various operations relating to the drive of the carrier tapes TP based on a control of the controller 91. Next, these operations are successively described in detail.

Figure 7:
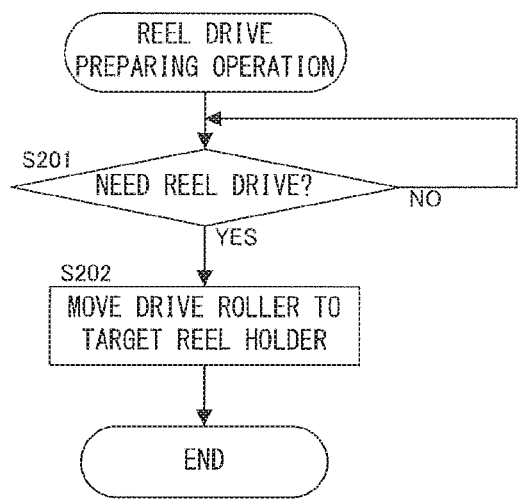
FIG. 7 is a flow chart showing an example of a reel drive preparing operation performed by the controller.

FIG. 7 is a flow chart showing an example of a reel drive preparing operation performed by the controller. In Step S201, the controller 91 confirms the reel holder 6 requiring the drive of the component supply reel R. That is, since the reel driving mechanism 8 has a configuration shown in FIGS. 4 and 5, the component supply reel R held by one of the plurality of reel holders 6 can be selectively rotated while the component supply reels R held by the other reel holders 6 are stopped. Specifically, the reel driving mechanism 8 moves the drive roller 733 to a position in contact with the driven roller 61 of the reel holder 6 set at one holder setting position Lh of the plurality of holder setting positions Lh. At this time, the drive roller 733 moves in the X direction while rubbing against the driven roller 61 located within the moving range thereof. Subsequently, the reel driving mechanism 8 rotates the drive roller 733, whereby the component supply reel R held at the reel holding position Lr1 of the reel holder 6 set at the one holder setting position Lh is selectively rotated and the component supply reels R of the reel holders 6 set at the other holder setting positions Lh are not rotated.

Accordingly, in Step S201, the controller 91 judges the presence or absence of the reel holder 6 requiring the drive of the component supply reel R in an operation planned to be performed later. If there is any such reel holder 6 among the plurality of reel holders 6 ("YES" in Step S201), this reel holder 6 is selected as a target reel holder 6 and the drive roller 733 is moved to a position in contact with the driven roller 61 of the target reel holder 6 (Step S202). In this way, the drive preparation of the component supply reel R of the target reel holder 6 is completed.

In the component mounter 1 configured as described above, the plurality of reel holders 6 are arranged in the X direction (alignment direction) and each reel holder 6 rotatably holds the component supply reels R wound with the carrier tapes TP storing the components. The reel driving mechanism 8 rotates the component supply reel R held by the target reel holder 6 selected out of the plurality of reel holders 6. Thus, the targeted component supply reel R can be precisely rotated while the rotation of the component supply reels R not required to rotate is prevented.

Particularly, the reel driving mechanism 8 includes the reel motor Mr and the drive roller 733 (drive rotating member) to be rotated by a torque (drive force) of the reel motor Mr, and the reel holder 6 as a rotation transmission target of the drive roller 733, to which the rotation of the drive roller 733 is transmitted, is switched among the plurality of reel holders 6 by the unit motor Mu (transmission switcher). In this way, the component supply reel R held by the target reel holder 6 is rotated by selectively transmitting the rotation of the drive roller 733 to the component supply reel R held by the target reel holder 6 among the plurality of reel holders 6. That is, the rotation of the drive roller 733 can be selectively transmitted to the component supply reel R held by the target reel holder 6 by the unit motor Mu for switching the reel holder 6 as the rotation transmission target of the drive roller 733. Thus, the targeted component supply reel R can be precisely rotated while the rotation of the component supply reels R not required to rotate is prevented.

Specifically, the reel holder 6 includes the driven roller 61 (following rotating member) to be rotated following the rotation of the drive roller 733 while being held in contact with the drive roller 733, and rotates the component supply reel R according to the rotation of the driven roller 61. Further, the reel motor Mr and the drive roller 733 are unitized as the driving unit 73. The unit motor Mu (unit driver) selectively brings the drive roller 733 into contact with the driven roller 61 of the target reel holder 6 by moving the driving unit 73 in the X direction, and the drive roller 733 is rotated thereby the component supply reel R held by the target reel holder 6 is rotated.

In such a configuration, out of the plurality of reel holders 6, the reel holder 6 whose driven roller 61 is in contact with the drive roller 733 is selected as the rotation transmission target of the drive roller 733. That is, the rotation of the drive roller 733 can be selectively transmitted to the component supply reel R held by the target reel holder 6 by driving the driving unit 73 by the unit motor Mu to switch the reel holder 6 whose driven roller 61 is in contact with the drive roller 733. Thus, the targeted component supply reels R can be precisely rotated while the rotation of the component supply reels R not required to rotate is prevented.

Further, the drive roller 733 and the driven roller 61 are magnet rollers, and the driven roller 61 is rotated following the rotation of the drive roller 733 by a magnetic force generated between the driven roller 61 and the drive roller 733. In such a configuration, the rotation of the drive roller 733 can be precisely transmitted to the driven roller 61 of the target reel holder 6 by the magnetic force of the magnet rollers. Further, since the transmission of the rotation does not depend on a friction force, a friction force between the drive roller 733 and the driven roller 61 can be made relatively small Thus, in driving the drive roller 733 to switch the rotation transmission target of the drive roller 733, there is a little influence on the driven roller 61 by the friction force between the driven roller 61 and the drive roller 733. That is, the rotation transmission target of the drive roller 733 can be switched while an influence on the driven roller 61 of the reel holder 6 and, eventually on the component supply reel R, is suppressed.

As just described, in the example of the reel drive preparing operation, the component mounter 1 corresponds to an example of a "component mounter" of the disclosure, the reel holder 6 corresponds to an example of a "reel holder" of the disclosure, the reel driving mechanism 8 corresponds to an example of a "reel driving mechanism" of the disclosure, the component supply reel R corresponds to an example of a "component supply reel" of the disclosure, the carrier tape TP corresponds to an example of a "tape" of the disclosure, the X direction corresponds to an example of an "alignment direction" of the disclosure, the reel motor Mr corresponds to an example of a "reel motor" of the disclosure, the drive roller 733 corresponds to an example of a "drive rotating member" of the disclosure, the unit motor Mu corresponds to an example of a "transmission switcher" of the disclosure, the driven roller 61 corresponds to an example of a "following rotating member" of the disclosure, the driving unit 73 corresponds to an example of a "driving unit" of the disclosure and the unit motor Mu corresponds to an example of a "unit driver" of the disclosure.

Figure 8:
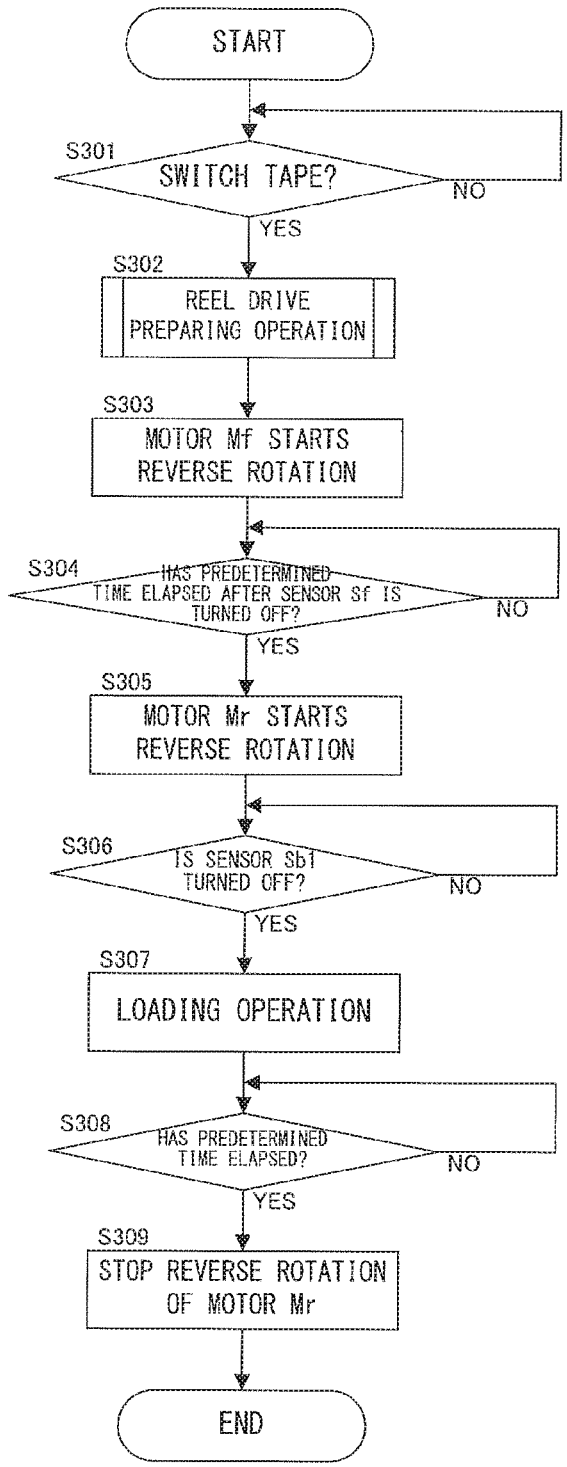
FIG. 8 is a flow chart showing a first mode of a carrier tape driving method.

FIG. 8 is a flow chart showing a first mode of a carrier tape driving method. This flow chart is carried out, for example, in switching the carrier tape TP used for component mounting according to a change in the type of boards B to be produced or the like. Such a flow chart is described with reference to FIG. 2.

In Step S301, the controller 91 compares a production plan for the boards B and a progress of component mounting on the boards B and judges whether or not the carrier tape TP needs to be switched. Note that whether or not the switch of the carrier tape TP is necessary can be judged based on various criteria. For example, the switch of the carrier tape TP can be judged to be necessary for a type of boards B to be produced next by the component mounter 1 when a production number of the type of the boards B being currently produced by the component mounter 1 reaches a number planned by a production plan. If the switch of the carrier tape TP is necessary ("YES" in Step S301), the reel drive preparing operation (FIG. 7) is performed (Step S302). By this reel drive preparing operation, the drive roller 733 selectively contacts the driven roller 61 of the reel holder 6 corresponding to the tape feeder 5 for which the switch of the carrier tape TP is performed. At this time, various methods for specifying the targeted tape feeder(s) 5 are considered. For example, the controller 91 can compare components of a type designated by a program for the boards B of the type whose production was finished and components of a type designated by a program for boards B of a type planned to be produced next and specify the tape feeder(s) 5 requiring the switch of the carrier tape TP. Alternatively, after the production of the boards B is finished, the controller 91 can specify the carrier tape(s) TP required to be switched based on a designation result of the tape feeder(s) 5 by the operator using the UI 92.

In Step S303, the feeder motor Mf of the tape feeder 5 for which the tape switch is performed starts rotating in the reverse direction. That is, the reverse rotation of the sprockets 57*d*, 57*u* is started from a state shown in Step S11 of FIG. 2, and the carrier tape TP1 engaged with the sprockets 57*d*, 57*u* is conveyed in the direction opposite to the feeding direction Df (toward the rear side) by the sprockets 57*d*, 57*u*. Then, whether or not a predetermined time has elapsed after the carrier tape TP1 was disengaged from the sprocket 57*d* and the output of the tape sensor Sf was turned from on to off is judged (Step S304). This predetermined time is set to correspond to a timing at which the carrier tape TP is disengaged from the sprocket 57*u*, specifically determined according to a distance from the tape sensor Sf to the sprocket 57*u* and a conveying speed of the carrier tape TP. If "YES" is judged in Step S304, the reverse rotation of the reel motor Mr is started. In this way, the component supply reel R held at the reel holding position Lr1 of the reel holder 6 as a target of the reel drive preparing operation starts rotating in the reverse rotation direction Db (FIG. 4) to start the winding of the carrier tape TP1.

If the carrier tape TP1 is extracted from the tape feeder 5 by the component supply reel R and the output of the tape sensor Sb1 is turned from on to off (Step S306), the loading operation is performed in Step S307. In this way, the leading end of the carrier tape TP2 is fed in the feeding direction Df from the tape attaching position La to the component supply position Ls and engaged with the sprockets 57*d*, 57*u*.

In Step S308, the controller 91 confirms whether or not a predetermined time has elapsed after the tape sensor Sb1 was turned off. If it can be judged that the predetermined time has elapsed and the winding of the carrier tape TP1 extracted from the tape feeder 5 on the component supply reel R has been completed ("YES" in Step S308), the reverse rotation of the reel motor Mr is stopped (Step S309) and the flow chart of FIG. 8 is finished.

In the component mounter 1 configured as described above, the unloading operation of winding the carrier tape TP on the component supply reel R by driving the component supply reel R to extract the component supply reel R from the tape feeder 5 is performed (Steps S305, S308 S309). That is, the carrier tape TP removed from the tape feeder 5 is wound on the component supply reel R. Thus, it is possible to suppress the interference of the preceding tape TP1 removed from the tape feeder 5 with the succeeding tape TP2.

At this time, the reel driving mechanism 8 drives the component supply reel R held by the reel holder 6 selected, out of the reel holders 6 set at the plurality of holder setting positions Lh, in the reverse rotation direction Db (Steps S302, S305). Thus, the targeted component supply reel R can be precisely rotated while the rotation of the component supply reels R not required to rotate is prevented.

Further, the tape feeder 5 can perform the loading operation of conveying the leading end of the carrier tape TP from the tape attaching position La to the component supply position Ls in the feeding direction Df (Step S307). Further, the reel holder 6 can hold the component supply reel R at each of the reel holding positions Lr1 and Lr2. If the reel driving mechanism 8 extracts the carrier tape TP from the tape feeder 5 according to the unloading operation for the component supply reel R held at one of the reel holding positions Lr1 and Lr2 (Steps S305, S306), the tape feeder 5 performs the loading operation for the component supply reel R held at the other reel holding position (Step S307). Thus, the switch of the carrier tape TP to be loaded into the tape feeder 5 can be quickly performed without depending on the user's manual operation.

Note that the timing at which the loading operation is started is not limited to this example and can be, for example, set earlier. That is, after the reel driving mechanism 8 starts the unloading operation for the component supply reel R held at one of the reel holding positions Lr1 and Lr2, the tape feeder 5 may start the loading operation for the component supply reel R held at the other reel holding position. In this way, the switch of the carrier tape TP to be loaded into the tape feeder 5 can be quickly performed without depending on the user's manual operation.

At this time, the carrier tape TP to which the unloading operation is performed is conveyed toward the upstream side in the feeding direction Df and exits from the common path Pc, whereas the carrier tape TP which the loading operation is performed is conveyed toward the downstream side in the feeding direction Df and reaches the common path Pc. Accordingly, the start timing of the loading operation may be so adjusted that the carrier tape TP to which the loading operation is performed reaches the common path Pc after the carrier tape TP to which the unloading operation is performed is removed from the common path Pc. In this way, the switch of the carrier tape TP to be loaded into the tape feeder 5 can be quickly performed without depending on the user's manual operation while the interference of the carrier tape TP to which the unloading operation is performed and the carrier tape TP to which the loading operation is performed is avoided. Note that such a start timing of the loading operation may be obtained in advance by calculation or an experiment and stored in the controller 91.

Further, the loading operation may be started based on a measurement result of an elapsed time after the start of the unloading operation by a timer. In this case, the tape sensor Sb1 can be omitted.

Further, the reel holder 6 includes the driven roller 61 and the following roller 62 for supporting the component supply reel R inserted through the upward facing opening 60A from below the center of the component supply reel R and the following roller 63 held in contact with the component supply reel R on the side above the center. In such a configuration, the upward escape of the component supply reel R from the reel holder 6 can be suppressed by the following roller 63.

As just described, in the example of the first mode of the carrier tape driving method, the component mounter 1 corresponds to an example of the "component mounter" of the disclosure, the reel holder 6 corresponds to an example of the "reel holder" of the disclosure, the tape feeder 5 corresponds to an example of the "tape feeder" of the disclosure, the reel driving mechanism 8 corresponds to an example of the "reel driving mechanism" of the disclosure, the component supply reel R corresponds to an example of the "component supply reel" of the disclosure, the carrier tape TP corresponds to an example of the "tape" of the disclosure, the forward rotation direction Da corresponds to an example of a "forward rotation direction" of the disclosure, the reverse rotation direction Db corresponds to an example of a "reverse rotation direction" of the disclosure, Steps S305, S308 and S309 correspond to an example of an "unloading operation" of the disclosure, the tape attaching position La corresponds to an example of a "tape attaching position" of the disclosure, the component supply position Ls corresponds to an example of a "component supply position" of the disclosure, the reel holding position Lr1 corresponds to an example of a "first holding position" of the disclosure, the reel holding position Lr2 corresponds to an example of a "second holding position" of the disclosure, Step S307 corresponds to an example of a "loading operation" of the disclosure, the feeder setting position Lf corresponds to an example of a "feeder setting position" of the disclosure, the holder setting position Lh corresponds to an example of a "holder setting position" of the disclosure, the X direction corresponds to an example of the "alignment direction" of the disclosure, the opening 60A corresponds to an example of an "opening" of the disclosure, each of the driven roller 61 and the following roller 62 corresponds to an example of a "supporting member" of the disclosure and the following roller 63 corresponds to an example of a "contact member" of the disclosure.

Figure 9:
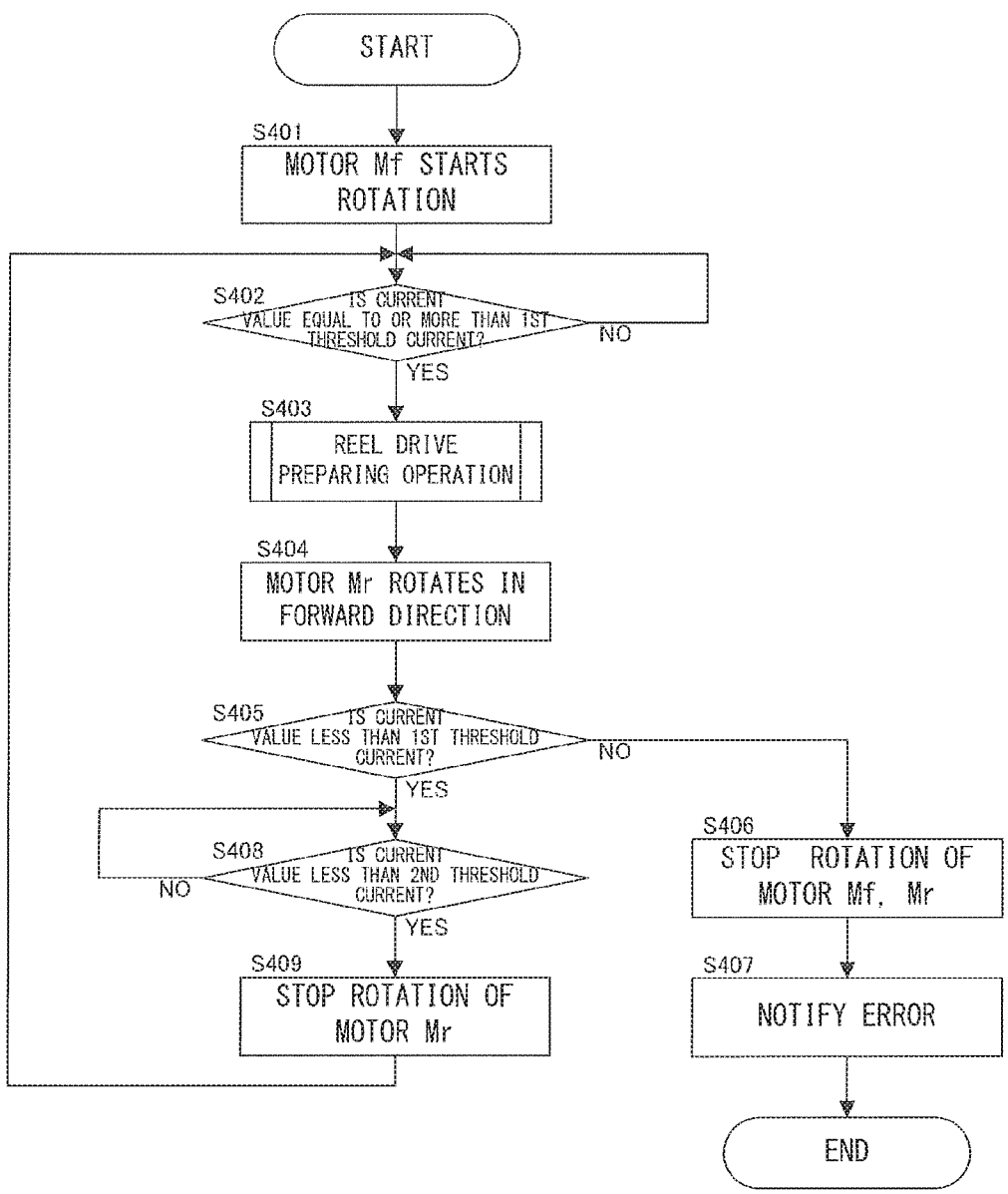
FIG. 9 is a flow chart showing a second mode of the carrier tape driving method.

FIG. 9 is a flow chart showing a second mode of the carrier tape driving method. This flow chart is carried out when component mounting is performed while the carrier tape TP loaded into the tape feeder 5 is intermittently conveyed in the feeding direction Df. Such a flow chart is described with reference to FIG. 3.

If the rotation of the feeder motor Mf is started and the intermittent conveyance of the carrier tape TP in the feeding direction Df is started as component mounting is started (Step S401), the controller 91 monitors a value of a current (current value Id) supplied from the motor driver Af to the feeder motor Mf of each of the plurality of tape feeders 5 (Step S402). When detecting the tape feeder 5 having the current value Id equal to or more than a first threshold current It1 ("YES" in Step S402), the controller 91 performs the reel drive preparing operation (FIG. 7) of preparing the drive of the driven roller 61 of the reel holder 6 corresponding to this tape feeder 5 (Step S403). In this way, the drive roller 733 contacts the driven roller 61 of the reel holder 6 corresponding to the tape feeder 5 having the current value Id equal to or more than the first threshold current It1.

If the controller 91 rotates the reel motor Mr in the forward direction in Step S404, the rotation of the reel motor Mr is transmitted to the component supply reel R at the reel holding position Lr1 of the reel holder 6 via the drive roller 733 and the driven roller 61, and the component supply reel R rotates in the forward rotation direction Da. In this way, the component supply reel R reels out the carrier tape TP in the feeding direction Df and the intermittent conveyance of the carrier tape TP in the feeding direction Df by the feeder motor Mf is assisted (feed assisting operation).

In Step S405, the controller 91 judges whether or not the current value Id supplied to the feeder motor Mf of the tape feeder 5 as a target of the feed assisting operation has dropped less than the first threshold current It1. That is, if the current value Id has increased to equal to or more than the first threshold current It1 due to an increase of a load of the feeder motor Mf by the rotation of the component supply reel R being obstructed by a foreign matter between the component supply reel R and the reel holder 6, it can be predicted that the load of the feeder motor Mf will be reduced and the current value Id will drop to less than the first threshold current It1 by the feed assisting operation. On the other hand, if a cause of increasing the current value Id to equal to or more than the first threshold current It1 is present on the side downstream of the component supply reel R in the feeding direction Df, it can be predicted that the load of the feeder motor Mf will not be reduced and the current value Id will remain equal to or more than the first threshold current It1 even if the feed assisting operation is performed. Accordingly, if the current value Id is judged to be equal to or more than the first threshold current It1 (NO) in Step S405, the controller 91 stops of the rotation of the feeder motor Mf and the reel motor Mr (Step S406) and notifies an error to the user by means of the UI 92 (Step S407).

On the other hand, if it is judged in Step S405 that the current value Id is less than the first threshold current (YES), the controller 91 judges whether or not the current value Id has dropped less than a second threshold current It2. Here, the second threshold current It2 is a current value lower than the first threshold current It1. That is, if a foreign matter is removed according to the rotation of the component supply reel R, it can be predicted that the load of the feeder motor Mf will further decrease and the current value Id supplied to the feeder motor Mf will be reduced. Accordingly, the controller 91 continues the feed assisting operation while the current value Id is equal to or more than the second threshold current It2 ("NO" in Step S408). On the other hand, if the current value Id drops less than the second threshold current It2 ("YES" in Step S408), the controller 91 finishes the rotation of the reel motor Mr to finish the feed assisting operation (Step S409) and returns to Step S402.

In the component mounter 1 configured as described above, such as when the rotation of the component supply reel R is obstructed by a foreign matter or the like sandwiched in the clearance between the component supply reel R and the reel holder 6, the component supply reel R is driven by the feed assisting operation, whereby the conveyance of the carrier tape TP in the feeding direction Df by the tape feeder 5 can be assisted (Step S404). Thus, the carrier tape TP can be properly conveyed by the tape feeder 5 regardless of a failure in the rotation of the component supply reel R.

Further, the controller 91 causes the reel driving mechanism 8 to perform the feed assisting operation if the current value Id supplied to the feeder motor Mf by the motor driver Af (current source) becomes equal to or more than the first threshold current It1 (Steps S402 to S404). That is, if the load of the feeder motor Mf of the tape feeder 5 becomes excessive and the current value Id supplied to the feeder motor Mf becomes equal to or more than the first threshold current It1 because the rotation of the component supply reel R is obstructed ("YES" in Step S402), the feed assisting operation is performed (Step S404). Thus, the carrier tape TP can be properly conveyed by the tape feeder 5 by reducing the load of the feeder motor Mf regardless of a failure in the rotation of the component supply reel R.

Further, the controller 91 causes the UI 92 (notifier) to notify an error (Steps S405, S407) if the current value Id does not become less than the first threshold current It1 after the start of the feed assisting operation. In such a configuration, an error is notified to the user to prompt a maintenance operation to the user if the load of the feeder motor Mf is not reduced despite the execution of the feed assisting operation.

As just described, in the example of the second mode of the carrier tape driving method, the component mounter 1 corresponds to an example of the "component mounter" of the disclosure, the reel holder 6 corresponds to an example of the "reel holder" of the disclosure, the tape feeder 5 corresponds to an example of the "tape feeder" of the disclosure, the reel driving mechanism 8 corresponds to an example of the "reel driving mechanism" of the disclosure, the component supply reel R corresponds to an example of the "component supply reel" of the disclosure, the carrier tape TP corresponds to an example of the "tape" of the disclosure, the feeding direction Df corresponds to an example of a "feeding direction" of the disclosure, the forward rotation direction Da corresponds to an example of the "forward rotation direction" of the disclosure, Step S404 corresponds to an example of a "feed assisting operation" of the disclosure, the controller 91 corresponds to an example of a "controller" of the disclosure, the feeder motor Mf corresponds to an example of a "feeder motor" of the disclosure, the motor driver Af corresponds to an example of a "current source" of the disclosure, and the UI 92 corresponds to an example of a "notifier" of the disclosure.

Figure 10:
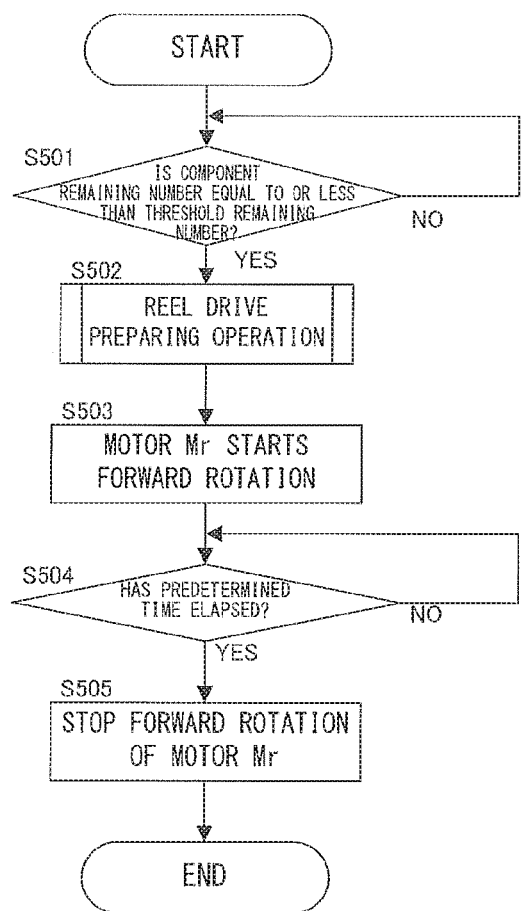
FIG. 10 is a flow chart showing a third mode of the carrier tape driving method.

FIG. 10 is a flow chart showing a third mode of the carrier tape driving method. This flow chart is carried out when the components in the carrier tape TP run out during component mounting using the carrier tape TP loaded into the tape feeder 5. Such a flow chart is described with reference to FIG. 3.

The controller 91 judges for each of the plurality of reel holders 6 during the execution of component mounting whether or not a remaining component number in the carrier tape TP wound on the component supply reel R held at the reel holding position Lr1 of the reel holder 6 has become equal to or less than a threshold remaining number (Step S501). Here, the threshold remaining number is an integer equal to or more than 1 and the judgment of Step S501 is made by comparing the number of the components stored in the carrier tape TP input by the user when the component supply reel R was set up and the number of the components used in component mounting.

When detecting the reel holder 6 holding the component supply reel R having the component remaining number equal to or less than the threshold remaining number ("YES" in Step S501), the controller 91 performs the reel drive preparing operation (FIG. 7) of preparing the drive of the driven roller 61 of this reel holder 6 (Step S502). In this way, the drive roller 733 contacts the driven roller 61 of the reel holder 6 having the component remaining number equal to or less than the threshold remaining number.

If the controller 91 rotates the reel motor Mr in the forward direction in Step S503, the forward rotation of the reel motor Mr is transmitted to the component supply reel R at the reel holding position Lr1 of the reel holder 6 via the drive roller 733 and the driven roller 61 and the component supply reel R rotates in the forward rotation direction Da. In this way, the component supply reel R rotates in the forward rotation direction Da to reel out the carrier tape TP in the feeding direction Df before the components in this carrier tape TP are used up during component mounting. If it can be judged that a predetermined time has elapsed after the start of the reel out of the carrier tape TP and the carrier tape TP has been removed from the component supply reel R, i.e. the end of the carrier tape TP wound on the component supply reel R has been removed from the component supply reel R ("YES" in Step S504), the forward rotation of the reel motor Mr is stopped (Step S505) and the flow chart of FIG. 10 is finished.

In the component mounter 1 configured as described above, the reel driving mechanism 8 performs a splicing preparing operation of removing the carrier tape TP from the component supply reel R by driving the component supply reel R in the forward rotation direction Da (Step S502 to S505). In such a configuration, the carrier tape TP can be removed from the component supply reel R in advance by performing the splicing preparing operation before the carrier tape TP is removed from the component supply reel according to the conveyance in the feeding direction Df by the tape feeder 5. Thus, the user can perform the splicing operation without waiting for the removal of the carrier tape TP from the component supply reel R according to the conveyance in the feeding direction Df by the tape feeder 5. In this way, a reduction in user operation efficiency associated with the splicing operation can be suppressed.

Further, the controller 91 causes the reel driving mechanism 8 to perform the splicing preparing operation if the component remaining number in the carrier tape TP wound on the component supply reel R become equal to or less than the threshold remaining number. In such a configuration, the carrier tape TP can be removed from the component supply reel R in advance by performing the splicing preparing operation if the component remaining number in the carrier tape TP wound on the component supply reel R become equal to or less than the threshold remaining number. Thus, the user can start the splicing operation when the component remaining number become equal to or less than the threshold remaining number. In this way, a reduction in user operation efficiency associated with the splicing operation can be suppressed.

As just described, in the example of the third mode of the carrier tape driving method, the component mounter 1 corresponds to an example of the "component mounter" of the disclosure, the reel holder 6 corresponds to an example of the "reel holder" of the disclosure, the tape feeder 5 corresponds to an example of the "tape feeder" of the disclosure, the reel driving mechanism 8 corresponds to an example of the "reel driving mechanism" of the disclosure, the feeding direction Df corresponds to an example of the "feeding direction" of the disclosure, the forward rotation direction Da corresponds to an example of the "forward rotation direction" of the disclosure, Steps S503, S504 and S505 correspond to an example of a "splicing preparing operation" of the disclosure, and the controller 91 corresponds to an example of the "controller" of the disclosure.

Figure 11:
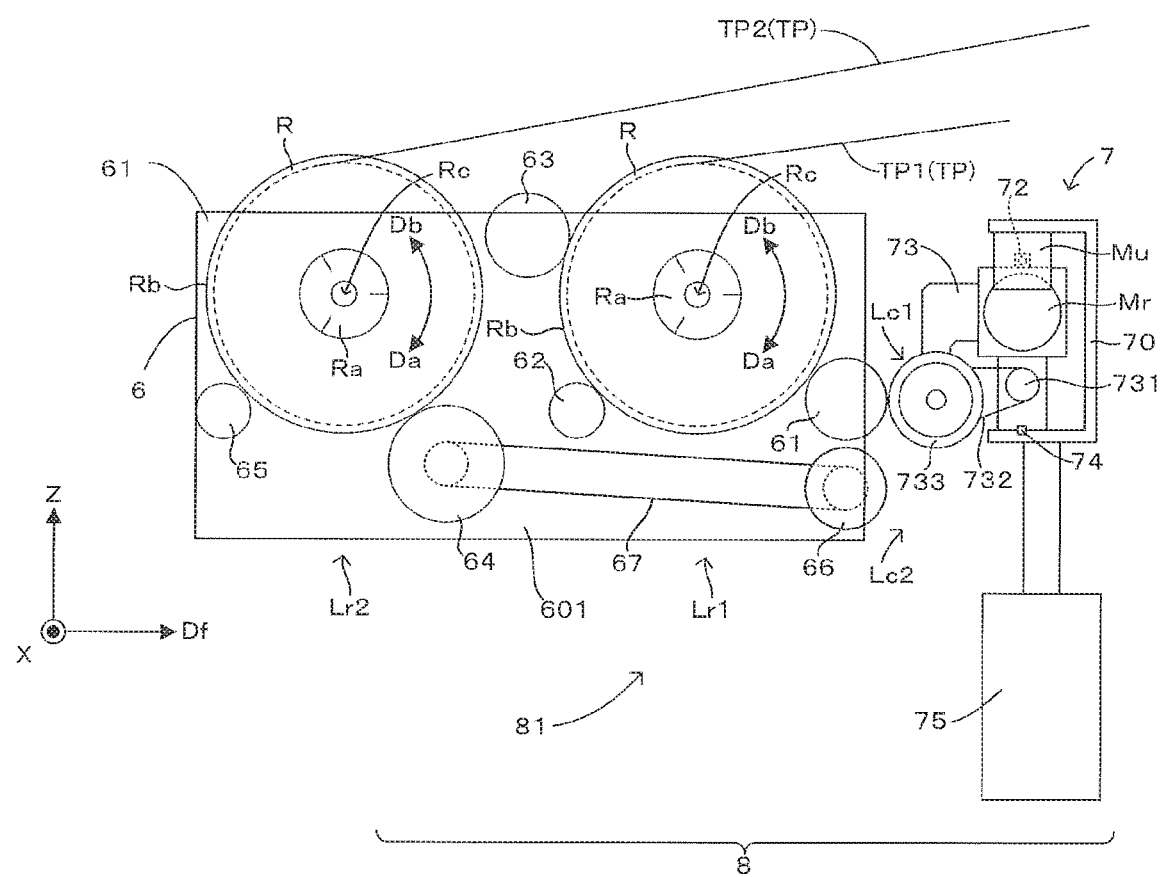
FIG. 11 is a side view schematically showing another example of the roller driver for driving the driven roller of the reel holder.

FIG. 11 is a side view schematically showing another example of the roller driver for driving the driven roller of the reel holder. Here, a configuration different from the example of FIG. 4 is mainly described, a common configuration is denoted by corresponding reference signs and the description thereof is omitted as appropriate. It goes without saying that similar effects are achieved by having the configuration common to the example of FIG. 4.

In the other example of FIG. 11, the reel holder 6 includes a driven roller 66 arranged side by side with the driven roller 61 in the Z direction and arranged below the driven roller 61, and an endless belt 67 hangs on the driven roller 66 and the following roller 64. Further, the driven roller 66 is a magnet roller. Furthermore, the reel driving mechanism 8 includes an actuator 75 for driving the roller driver 7 in the Z direction. The actuator 75 can position the drive roller 733 at either one of a first contact position Lc1 where the drive roller 733 is in contact with the driven roller 61 and a second contact position Lc2 where the drive roller 733 is in contact with the driven roller 66 by driving the roller driver 7.

Accordingly, if the drive roller 733 rotates while being located at the first contact position Lc1, the driven roller 61 rotates following the rotation of the drive roller 733 by a magnetic force between the drive roller 733 and the driven roller 61, and the component supply reel R at the reel holding position Lr1 rotates following the rotation of the driven roller 61. On the other hand, if the drive roller 733 rotates while being located at the second contact position Lc2, the driven roller 66 rotates following the rotation of the drive roller 733 by a magnetic force between the drive roller 733 and the driven roller 66. Further, the endless belt 67 rotates following the rotation of the driven roller 66, and the following roller 64 rotates following the rotation of the endless belt 67. Then, the component supply reel R rotates following the rotation of the following roller 64 by a friction force between the following roller 64 and the component supply reel R at the reel holding position Lr2. Note that the rotation direction of the component supply reel R at each of the reel holding positions Lr1, Lr2 can be changed between the forward rotation direction Da and the reverse rotation direction Db by changing the rotation direction of the reel motor Mr.

In the component mounter 1 configured as described above, the reel driving mechanism 8 drives one component supply reel R by switching the one component supply reel R, to which the rotation of the drive roller 733 is transmitted, between the component supply reel R held at the reel holding position Lr1 and the component supply reel R held at the reel holding position Lr2. Therefore, the controller 91 can execute the control of FIG. 7, 8, 9 or 10 not only for the component supply reel R at the reel holding position Lr, but also for the component supply reel R at the reel holding position Lr2.

Particularly, by rotating one component supply reel R of the two component supply reels R held by the reel holder 6 in the reverse rotation direction Db, the unloading operation can be selectively performed for the one component supply reel. In this example, the actuator 75, the driven roller 61, the following roller 64 the driven roller 66 and the endless belt 67 function in cooperation as a "rotation transmitter 81".

Further, the rotation transmitter 81 can switch the component supply reel R, to which the rotation of the reel motor Mr is transmitted, between the two component supply reels R on the reel holder 6 by switching the position of the drive roller 733 between the first and second contact positions Lc1, Lc2 by the actuator 75. In such a configuration, the unloading operation can be selectively performed for one of the two component supply reels R held by the reel holder 6 by changing the position of the drive roller 733 by the actuator 75.

As just described, in the other example of the roller driver, the reel driving mechanism 8 corresponds to an example of the "reel driving mechanism" of the disclosure, the reel motor Mr corresponds to an example of the "reel motor" of the disclosure, the drive roller 733 corresponds to an example of the "drive rotating member" of the disclosure, the rotation transmitter 81 corresponds to an example of a "rotation transmitter" of the disclosure, the driven roller 61 corresponds to an example of a "first output rotator" of the disclosure, the following roller 64 corresponds to an example of a "second output rotator" of the disclosure, the driven roller 66 corresponds to an example of an "intermediate rotating member" of the disclosure, the endless belt 67 corresponds to an example of an "endless belt" of the disclosure, the actuator 75 corresponds to an example of an "actuator" of the disclosure, the first contact position Lc1 corresponds to an example of a "first contact position" of the disclosure, and the second contact position Lc2 corresponds to an example of a "second contact position" of the disclosure.

Figure 12:
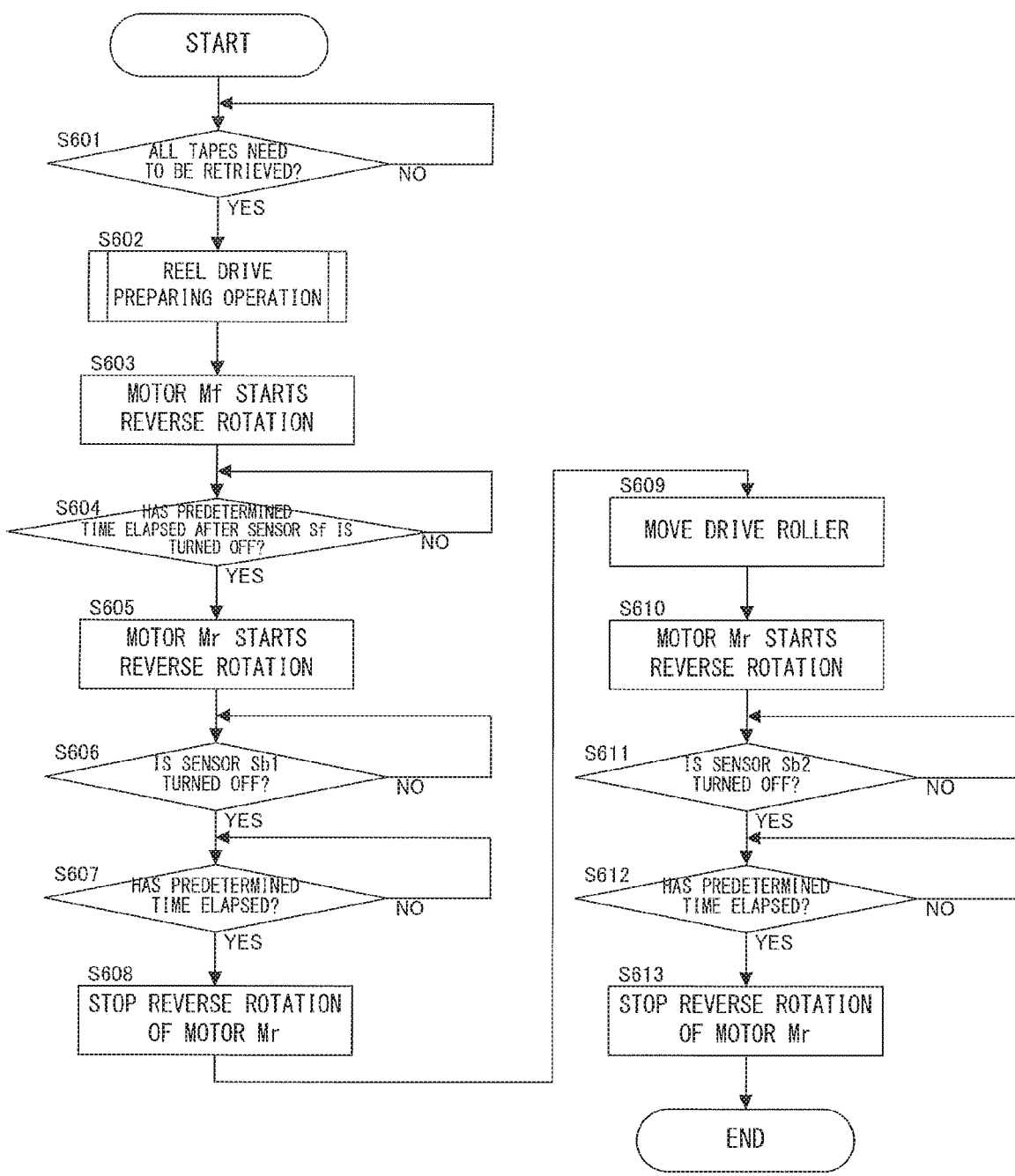
FIG. 12 is a flow chart showing a fourth mode of the carrier tape driving method.

FIG. 12 is a flow chart showing a fourth mode of the carrier tape driving method. This flow chart is carried out when both of the two carrier tapes TP attached to the tape feeder 5 are retrieved from the tape feeder 5. Such a retrieval of the carrier tapes TP is performed as appropriate according to a change in the type of boards B to be produced or the like. Such a flow chart is described with reference to FIG. 11.

The controller 91 judges whether or not there is any tape feeder 5 from which both of the two carrier tapes TP need to be retrieved (Step S601). Specifically, the retrieval is judged to be necessary when the type of boards B to be produced is changed or the production of the type of boards B is ended. Upon detecting the tape feeder 5 from which both of the two carrier tapes TP need to be retrieved ("YES" in Step S601), the controller 91 performs the reel drive preparing operation (FIG. 7) of preparing the drive of the driven roller 61 of the reel holder 6 corresponding to this tape feeder 5 (Step S602).

In Step S603, the feeder motor Mf of the tape feeder 5 from which the both carrier tapes TP are retrieved starts rotating in the reverse direction. In this way, the sprockets 57d, 57u start rotating in the reverse direction and the carrier tape TP1 engaged with the sprockets 57d, 57u is conveyed rearward with respect to the feeding direction Df by the sprockets 57d, 57u. If a predetermined time elapses after the output of the tape sensor Sf turned from on to off as described in detail in Step S304 described above ("YES" in Step S604), the reel motor Mr starts rotating in the reverse direction (Step S605). In this way, the component supply reel R held at the reel holding position Lr1 of the reel holder 6 starts rotating in the reverse rotation direction Db to start the winding of the carrier tape TP1.

In Step S606, the controller 91 confirms whether or not the carrier tape TP1 has been extracted from the tape feeder 5 by the component supply reel R and the output of the tape sensor Sb1 has been turned from on to off. If it can be judged that a predetermined time had elapsed ("YES" in Step S607) after the output of the tape sensor Sb was turned off ("YES" in Step S606) and the winding of the carrier tape TP1 extracted from the tape feeder 5 on the component supply reel R has been completed, the reverse rotation of the reel motor Mr is stopped (Step S608).

In Step S609, the controller 91 moves the drive roller 733 from the first contact position Lc1 to the second contact position Lc2. In Step S610, the reel motor Mr starts rotating in the reverse direction and the component supply reel R held at the reel holding position Lr2 of the reel holder 6 starts rotating in the reverse rotation direction Db to start the winding of the carrier tape TP2. At this time, the feeder motor Mb starts rotating in the reverse direction to rotate the sprocket 54 in the reverse direction simultaneously with or before the start of the reverse rotation of the reel motor Mr. In Step S611, the controller 91 confirms whether or not the carrier tape TP2 has been extracted from the tape feeder 5 by the component supply reel R and the output of the tape sensor Sb2 has been turned from on to off. If it can be judged that a predetermined time has elapsed ("YES" in Step S612) after the output of the tape sensor Sb was turned off ("YES" in Step S611) and the winding of the carrier tape TP2 extracted from the tape feeder 5 on the component supply reel R has been completed, the reverse rotation of the reel motor Mr is stopped (Step S613) and the flow chart of FIG. 12 is finished.

In the component mounter 1 configured as described above, the two carrier tapes TP can be retrieved from the tape feeder 5 by the reel motor Mr. Therefore, an operation burden of the user can be reduced.

Note that the disclosure is not limited to the above embodiment and various changes can be added to the aforementioned embodiment without departing from the gist of the disclosure. For example, the drive roller 733, the driven roller 61 and the other rollers need not be magnet rollers and may be rubber rollers having a circumferential surface made of rubber. In such a configuration, the driven roller 61 rotates following the drive roller 733 by a friction force generated between the driven roller 61 and the drive roller 733. That is, the rotation of the drive roller 733 can be precisely transmitted to the driven roller 61 of the targeted reel holder 6 by the friction force of the rubber rollers.

Further, the component supply reel R rotates following the driven roller 61 by the friction force between the component supply reel R and the driven roller 61. At this time, the peripheral edges of the side plates Rb of the component supply reel R may be made of rubber. In this way, the component supply reel R can be precisely rotated by reliably ensuring the friction force between the component supply reel R and the driven roller 61.

Figure 13:
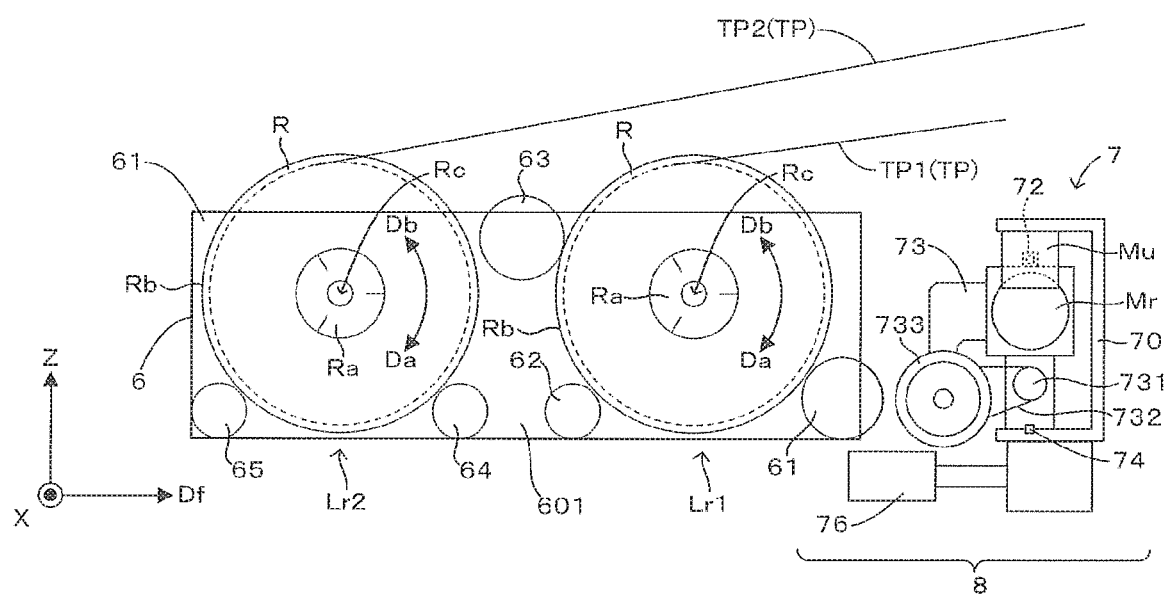
FIG. 13 is a side view schematically showing another example of the roller driver for driving the driven roller of the reel holder.

FIG. 13 is a side view schematically showing another example of the roller driver for driving the driven roller of the reel holder. Here, a configuration different from the example of FIG. 4 is mainly described, a common configuration is denoted by corresponding reference signs and the description thereof is omitted as appropriate. It goes without saying that similar effects are achieved by having the configuration common to the example of FIG. 4.

In the other example of FIG. 13, the drive roller 733 and the driven roller 61 are rubber rollers. Further, the reel driving mechanism 8 includes an actuator 76 for driving the roller driver 7 in the feeding direction Df. The actuator 76 can move the drive roller 733 from a position in contact with the driven roller 61 to a position separated from the driven roller 61 (position of FIG. 13) by driving the roller driver 7 in the feeding direction Df. Further, the actuator 76 can move the drive roller 733 from the position separated from the driven roller 61 to the position in contact with the driven roller 61 by driving the roller driver 7 toward the opposite side (rear side) in the feeding direction Df.

In driving the component supply reel R at the reel holding position Lr1 by the reel motor Mr, the reel driving mechanism 8 rotates the reel motor Mr with the drive roller 733 held in contact with the driven roller 61. On the other hand, in moving the driving unit 73 in the X direction according to the reel drive preparing operation of FIG. 7, the reel driving mechanism 8 separates the drive roller 733 from the driven roller 61 in the feeding direction Df. That is, the driving unit 73 is moved in the X direction by the unit motor Mu with the drive roller 733 separated from the driven roller 61.

As just described, in the other example of FIG. 13, the drive roller 733 is separated from the driven roller 61 in driving the drive roller 733 in the X direction to switch the rotation transmission target of the drive roller 733. Thus, the drive roller 733 can be moved in a state where no friction force is generated between the drive roller 733 and the driven roller 61. Therefore, the rotation transmission target of the drive roller 733 can be switched while an influence on the driven roller 61 of the reel holder 61, eventually on the component supply reel R, is suppressed.

Further, in the above embodiment, the transmission of the rotation from the drive roller 733 to the driven roller 61 and the transmission of the rotation from the driven roller 61 to the component supply reel R are achieved by magnet or rubber. However, a specific configuration for transmitting the rotation is not limited to this. Thus, the rotation may be transmitted by the engagement of gears. The same applies also to the transmission of the rotation from the drive roller 733 to the driven roller 66 and the transmission of the rotation from the following roller 64 to the component supply reel R.

Further, the reel holder 6 holds the component supply reels R by the following rollers 62, 63, 64 and 65. However, instead of this, the reel holder 6 may be so configured to hold the component supply reels R by non-rotational pins or the like.

Further, in the reel drive preparing operation, one target reel holder 6 is selected out of the plurality of reel holders 6. However, N (N is an integer smaller than M and equal to or more than 2) target reel holders 6 may be selected, for example, out of M (M is an integer equal to or more than 2) reel holders 6 and the component supply reels R held by these N reel holders 6 may be selectively rotated.

Further, the configuration of the tape feeder 5 can also be changed as appropriate. Accordingly, the tape feeder 5 may be configured to include two tape conveyance paths 53b corresponding to two carrier tapes TP1, TP2 and sprockets 54 provided in the respective tape conveyance paths 53b. In this case, the tape feeder 5 may be so configured that the carrier tape TP2 is loaded to the component supply position Ls and the carrier tape TP1 is caused to wait near the tape insertion opening 53a.

Further, the reel driving mechanism 8 may be provided for each of the two component supply reels R held by the reel holder 6.

What is claimed is:

1. A component mounter, comprising:
   a reel holder configured to rotatably hold a first component supply reel wound with a first tape storing components and a second component supply reel wound with a second tape storing components;
   a tape feeder to which the first tape is pulled out from the first component supply reel is loaded and which is configured to supply the components stored in the first tape by conveying the first tape in a feeding direction towards a component supply position where the components stored in the first tape are supplied to the component mounter; and
   a reel driving mechanism configured to rotate the first component supply reel held by the reel holder by contacting and applying a drive force to the first component supply reel that is to be rotated,
   wherein:
   the first component supply reel is configured to rotate in a forward rotation direction following the first tape being conveyed in the feeding direction by the tape feeder,
   the second component supply reel is configured to rotate in the forward rotation direction following the second tape being conveyed in the feeding direction by the tape feeder, and
   the reel driving mechanism is configured to perform an unloading operation of extracting the first tape from the tape feeder by applying the drive force to the first component supply reel in a reverse rotation direction opposite to the forward rotation direction to wind the first tape on the first component supply reel.

2. The component mounter according to claim 1, wherein:
   the tape feeder has a tape attaching position, to which a leading end of the second tape pulled out from the second component supply reel is attached, and the component supply position which is provided further in the feeding direction than the tape attaching position, and is configured to perform a loading operation of conveying the leading end of the second tape attached at the tape attaching position to the component supply position in the feeding direction,
   a part of a path in which the first tape to which the unloading operation is performed passes and a part of a path in which the second tape to which the loading operation is performed passes are in common and form a common path,
   the reel holder is configured to hold the first component supply reel at a first holding position and the second component supply reel at a second holding position different from the first holding position,
   after the reel driving mechanism starts the unloading operation for the first component supply reel held at the first holding position, the tape feeder starts the loading operation for the second tape of the second component supply reel held at the second holding position, and the second tape to which the loading operation is performed reaches the common path after the first tape to which the unloading operation is performed is removed from the common path.

3. The component mounter according to claim 2, wherein the reel driving mechanism includes a reel motor, a drive rotating member to be rotated by a drive force of the reel motor, and a rotation transmitter configured to switch which of the first and second component supply reels to which rotation of the drive rotating member is transmitted between the first component supply reel held at the first holding position and the second component supply reel held at the second holding position, and the rotation transmitter being configured to drive one of the first and second component supply reels, to which the rotation of the drive rotating member is transmitted, in the reverse rotation direction.

4. The component mounter according to claim 3, wherein:
the rotation transmitter includes a first output rotating member configured to contact the first component supply reel held at the first holding position, a second output rotating member configured to contact the second component supply reel held at the second holding position, an intermediate rotating member, an endless belt configured to transmit rotation of the intermediate rotating member to the second contact member, and an actuator configured to change a position of the drive rotating member between a first contact position where the drive rotating member is in contact with the first output rotating member and a second contact position where the drive rotating member is in contact with the intermediate rotating member, wherein if the drive rotating member rotates while being located at the first contact position, the first output rotating member rotates following the rotation of the drive rotating member and the first component supply reel at the first holding position rotates following rotation of the first output rotating member, and if the drive rotating member rotates while being located at the second contact position, the intermediate rotating member rotates following the rotation of the drive rotating member, the endless belt rotates following the rotation of the intermediate rotating member, the second output rotating member rotates following rotation of the endless belt and the second component supply reel at the second holding position rotates following rotation of the second output rotating member.

5. The component mounter according to claim 1, wherein:
a plurality of the tape feeders are set at each of a plurality of feeder setting positions arranged in an alignment direction orthogonal to the feeding direction, a plurality of the reel holders are set at each of a plurality of holder setting positions provided to correspond to the plurality of feeder setting positions and arranged in the alignment direction, the first tapes pulled out from the reel holders are loaded into the tape feeders set at the feeder setting positions corresponding to the holder setting positions where the reel holders are set, and the reel driving mechanism is configured to drive the first component supply reel held by a target reel holder selected, out of the reel holders set at the plurality of holder setting positions, in the reverse rotation direction.

6. The component mounter according to claim 1, wherein the reel driving mechanism is configured to perform a feed assisting operation of driving the first component supply reel in the forward rotation direction as the tape feeder conveys the first tape in the feeding direction.

7. The component mounter according to claim 1, wherein the reel driving mechanism is configured to perform a splicing preparing operation of removing the first tape from the first component supply reel by driving the first component supply reel in the forward rotation direction.

8. The component mounter according to claim 1, wherein the reel holder includes a supporting member configured to support the first component supply reel inserted through an upward facing opening from below a center of the first component supply reel, and a contact member configured to contact the first component supply reel on a side above the center.

9. A component supply reel driving method for a component mounter comprising a reel holder configured to rotatably hold a first component supply reel wound with a first tape storing components and a second component supply reel wound with a second tape storing components, a tape feeder to which the first tape is pulled out from the first component supply reel is loaded and which is configured to supply the components stored in the first tape by conveying the first tape in a feeding direction towards a component supply position where the components stored in the first tape are supplied to the component mounter, and a reel driving mechanism configured to rotate the first component supply reel held by the reel holder by contacting and applying a drive force to the first component supply reel that is to be rotated, wherein the first component supply reel is configured to rotate in a forward rotation direction following the first tape being conveyed in the feeding direction by the tape feeder, the component supply reel driving method comprising:

judging whether or not to extract the first tape storing components from the tape feeder; and performing an unloading operation of extracting the first tape from the tape feeder by applying the drive force to the first component supply reel in a reverse rotation direction opposite to the forward rotation direction to wind the first tape on the first component supply reel when judging to extract the first tape.

* * * * *